(12) United States Patent
Kemnitz

(10) Patent No.: US 10,081,004 B2
(45) Date of Patent: Sep. 25, 2018

(54) PROCESS FOR PRODUCTION OF MAGNESIUM FLUORIDE SOL SOLUTIONS FROM ALKOXIDES COMPRISING ADDITION OF MAGNESIUM SALTS

(71) Applicant: NANOFLUOR GMBH, Berlin (DE)

(72) Inventor: Erhard Kemnitz, Berlin (DE)

(73) Assignee: NANOFLUOR GMBH, Berlin (DE)

(*) Notice: Subject to any disclaimer, the term of this patent is extended or adjusted under 35 U.S.C. 154(b) by 95 days.

(21) Appl. No.: 14/428,989

(22) PCT Filed: Sep. 18, 2013

(86) PCT No.: PCT/EP2013/069412
§ 371 (c)(1),
(2) Date: Mar. 18, 2015

(87) PCT Pub. No.: WO2014/044726
PCT Pub. Date: Mar. 27, 2014

(65) Prior Publication Data
US 2015/0231587 A1    Aug. 20, 2015

(30) Foreign Application Priority Data
Sep. 18, 2012 (EP) .................................. 12184916

(51) Int. Cl.
 B01J 13/00 (2006.01)
 C03C 17/22 (2006.01)
 C09D 1/00 (2006.01)
(52) U.S. Cl.
 CPC ............ *B01J 13/0004* (2013.01); *C03C 17/22* (2013.01); *C09D 1/00* (2013.01); *Y10T 428/31678* (2015.04)

(58) Field of Classification Search
None
See application file for complete search history.

(56) References Cited

FOREIGN PATENT DOCUMENTS

| EP | 2253590 | 11/2010 |
| KR | 10-2007-0050052 | 5/2007 |
| WO | 2006030848 | 3/2006 |

OTHER PUBLICATIONS

Izawa et al, WO 2006030848, English Translation from WIPO database.*

(Continued)

*Primary Examiner* — Colin W Slifka
(74) *Attorney, Agent, or Firm* — JMB Davis Ben-David

(57) ABSTRACT

The invention relates to a method for obtaining a magnesium fluoride ($MgF_2$) sol solution, comprising the steps of providing a magnesium alkoxide precursor in a non-aqueous solvent and adding 1.85 to 2.05 molar equivalents of non-aqueous hydrofluoric acid, characterized in that the reaction proceeds in the presence of a second magnesium fluoride precursor selected from the group of salts of strong, volatile acids, such as chloride, bromide, iodide, nitrate or triflate of magnesium, or of a catalytic amount of a strong, volatile acid; and/or an additive non-magnesium fluoride precursor selected from the group of salts of strong, volatile acids, such as a chloride, bromide, iodide, nitrate or triflate of lithium, antimony, tin calcium, strontium, barium, aluminum, silicon, zirconium, titanium or zinc. The invention further relates to sol solutions, method of applying the sol solutions of the invention to surfaces as a coating, and to antireflective coatings obtained thereby.

8 Claims, 5 Drawing Sheets

(56) References Cited

OTHER PUBLICATIONS

Karg et al, "Mechanistic insight into formation and changes of nanoparticles in MgF2 sols evidenced by liquid and solid state NMR," Dalton Trans., 2012, 41, 2360-2366.*
M. Karg et al: "Mechanistic insight into formation and changes of nanoparticles in MgF2 sols evidenced by liquid and solid state NMR", Dalton Transactions, vol. 41, No. 8, Jan. 1, 2012 (Jan. 1, 2012), p. 2360.
S. Wuttke et al: "Variation of sol-gel synthesis parameters and their consequence for the surface area and structure of magnesium fluoride", Journal of Materials Chemistry, vol. 17, No. 47, Jan. 1, 2007 (Jan. 1, 2007), p. 4980.

* cited by examiner

PROCESS FOR PRODUCTION OF MAGNESIUM FLUORIDE SOL SOLUTIONS FROM ALKOXIDES COMPRISING ADDITION OF MAGNESIUM SALTS

CROSS-REFERENCE TO RELATED APPLICATIONS

This is the U.S. National Stage of International Application No. PCT/EP2013/069412, filed Sep. 18, 2013, which was published in English under PCT Article 21(2), which in turn claims the benefit of EP Patent Application No. 12184916.0, filed Sep. 18, 2012.

The present invention relates processes for the synthesis of $MgF_2$ sols from magnesium alkoxides, and methods for manufacturing optically active surface coatings comprising $MgF_2$ as optically active component. The invention also encompasses solar panels, architectural glass, optical systems and lenses coated by the surface coatings of the invention.

The reduction of light reflection is desirable in many applications such as photovoltaic and photothermic elements, architectural glass or optical elements. The reflection of visible light passing through an optically transparent substrate (e.g., glass) can be reduced by coating the substrate with an optical active thin layer exhibiting a refractive index laying between the refractive index of the substrate ($n_s \sim 1.5$ in case of glass) and that of air ($n_{air}=1$). An ideal single layer coating material would have a refractive index around $n_c \sim 1.23$, resulting in a nearly 100% optically transparent system (see FIG. 1).

Multi-layer systems (interference layers, usually alternating layers of high reflective $TiO_2$— and low reflective $SiO_2$-films) are known in the art. They suffer from high production costs and complex methods of manufacture.

Anti-reflective (AR) oxide monolayers are known in the art. The oxide material with the lowest refractive index is $SiO_2$ ($n_{SiO2} \sim 1.46$). To achieve lower n values, porosity has to be introduced into such layers. Up to more than 50% porosity, however, is needed to provide porous layers with n=1.23, resulting in low mechanic stability of such layers.

Some metal fluorides exhibit refractive indexes significantly lower than $SiO_2$. Magnesium fluoride is the most investigated material ($n_{MgF2}=1.38$). Other properties such as scratch resistance, mechanic stability, thermal stability and hydrolysis resistance are important for applications such as coatings of glass or polymers.

Vapor phase deposition methods such as sputtering can be employed for film deposition. Thin layers obtained thereby do usually not show significant porosity, resulting in a refractive index of close to or corresponding to that of the bulk material. Vapor phase deposited $MgF_2$-layers suffer from non-stoichiometric adjustment of metal to fluorine ratios, leading to point defects ("F-center") formation, resulting in impaired optical quality of the layer. Evaporation methods may aid in overcoming this problem, however large area depositions are not facilitated thereby because of point defect formation. The introduction of the necessary porosity is insufficient in both methods.

Metal fluoride layers generated from liquid phase deposition were described first based on metal trifluoroacetate sols (S. Fujihara, in *Handbook of Sol-Gel Science and Technology*, ed. S. Sakka, Kluwer, Boston, 2005, vol. 1, pp. 203-224). In a first step, the metal fluoride trifluoroactetates are deposited onto the substrate and are subsequently decomposed thermally, resulting in very porous metal fluoride layers. Due to the formation of hydrogen fluoride during this thermal decomposition process and a drastic shrinking of the layer thickness, an adjustment of the parameters of such layers is difficult. Moreover, the coated substrate as well as the equipment can undergo corrosion caused by evaporated hydrogen fluoride gas. Insufficient mechanical performance of the resulting layer is a further drawback of this technology.

U.S. Pat. No. 6,880,602B2 (EP 1 315 005 B1) shows a process for obtaining sol solutions of magnesium fluoride by reacting magnesium acetate or methoxide with aqueous hydrofluoric acid in methanol at elevated temperatures under high pressure. This process suffers from significant disadvantages when applied in technical scale, such as the need for high pressure batch reactions and the use of methanol.

US 2011/0122497 A1 (EP 1 791 002 A1) shows $MgF_2$-sols obtained by a high pressure process, with added $SiO_2$-sols as "binders", which results in acceptable optical and mechanical characteristics of the layers.

Clear magnesium fluoride based sol solutions that are suitable for coating glasses have not been accessible so far from alkoxides other than from magnesium methoxide. Furthermore, the methoxide has only been accessible in methanol, a solvent that poses problems related to its toxicity and workplace safety profile. Magnesium methoxide is not soluble in ethanol or isopropanol, thus blocking the path to clear sol solutions. Magnesium ethoxide, which is available commercially at lower prices, does not dissolve directly in methanol, ethanol or isopropanol.

The present invention aims at the preparation of low refractive index antireflective layers that overcome the drawbacks of the state of the art, particularly in providing a general pathway to obtain clear sol solutions suitable for antireflective coatings, from magnesium alkoxides, particularly magnesium methoxide or ethoxide. This problem is solved by the methods, preparations and coatings as defined by the independent claims.

According to a first aspect of the invention, a method for obtaining a magnesium fluoride ($MgF_2$) sol solution is provided, comprising the steps of a. providing a magnesium alkoxide ($Mg(OR)_2$) in a non-aqueous solvent in a first volume and
b. adding, in a second volume, 1.85 to 2.05 molar equivalents of anhydrous hydrogen fluoride (HF) to said magnesium alkoxide,
characterized in that
c. the reaction proceeds in the presence of
   i. a second magnesium fluoride precursor selected from the group of salts of strong, volatile acids, such as chloride, bromide, iodide, nitrate or triflate of magnesium and/or
   ii. at least one additive non-magnesium fluoride precursor selected from the group of salts of strong, volatile acids, such as chloride, bromide, iodide, nitrate or triflate of lithium, antimony, tin, calcium, strontium, barium, aluminium, silicon, zirconium, titanium and/or zinc.

In some embodiments, said reaction proceeds in the presence of a catalytic amount of a strong, volatile acid and
   i. a second magnesium fluoride precursor selected from the group of salts of strong, volatile acids, such as chloride, bromide, iodide, nitrate or triflate of magnesium and/or
   ii. at least one additive non-magnesium fluoride precursor selected from the group of salts of strong, volatile acids, such as chloride, bromide, iodide, nitrate or triflate of of lithium, antimony, tin, calcium, strontium, barium, aluminium, silicon, zirconium, titanium and/or zinc.

In some embodiments, the magnesium alkoxide is magnesium methylate (Mg(OMe)$_2$), magnesium ethylate(Mg(OEt)$_2$), magnesium propylate(Mg(OPr)$_2$) or magnesium butylate(Mg(OBu)$_2$), in particular magnesium ethylate and magnesium methylate.

In some embodiments, the magnesium alkoxide is magnesium ethylate(Mg(OEt)$_2$), magnesium propylate(Mg(OPr)$_2$) or magnesium butylate(Mg(OBu)$_2$), in particular magnesium ethylate.

According to a second aspect of the invention, a method for obtaining a magnesium fluoride (MgF$_2$) sol solution is provided, comprising the steps of
 a. providing a magnesium ethanolate (Mg(OEt)$_2$), propylate (Mg(OPr)$_2$) or buthylate (Mg(OBu)$_2$), in particular a magnesium ethanolate, in a non-aqueous solvent, in particular in ethanol or isopropanol, in a first volume and
 b. adding, in a second volume, 1.85 to 2.05 molar equivalents of anhydrous hydrogen fluoride (HF) to said magnesium alkoxide,
 characterized in that
 c. the reaction proceeds in the presence of a catalytic amount of a strong, volatile acid.

In some embodiments, said method for obtaining a magnesium fluoride (MgF$_2$) sol solution comprises the steps of
 a. providing a magnesium ethanolate, in a non-aqueous solvent, in particular in ethanol or isopropanol, in a first volume and
 b. adding, in a second volume, 1.85 to 2.05 molar equivalents of anhydrous hydrogen fluoride (HF) to said magnesium alkoxide,
 characterized in that
 c. the reaction proceeds in the presence of a catalytic amount of a strong, volatile acid, and
  i. a second magnesium fluoride precursor selected from the group of salts of strong, volatile acids, such as a salt of a chloride, bromide, iodide, nitrate or triflate of magnesium, and/or
  ii. at least one additive non-magnesium fluoride precursor selected from the group of salts of strong, volatile acids, such as a salt of a chloride, bromide, iodide, nitrate or triflate of of lithium, antimony, tin, calcium, strontium, barium, aluminium, silicon, zirconium, titanium or zinc.

If not stated otherwise, the following embodiments and descriptions refer to the first and the second aspect of the invention.

The inventors have surprisingly found that addition of a second magnesium fluoride precursor and/or an additive non-magnesium fluoride precursor to the Mg-alkoxide solvent system facilitates the sol reaction and improves the optical and mechanical properties of the coating layers obtained from the resultant sols. The coatings derived thereof show increased amorphicity and porosity.

As used herein, the term "a second magnesium fluoride precursor" (also referred to as "second magnesium precursor") refers to an additional magnesium compound present in the fluorination reaction. Depending on the reaction conditions, this compound may be completely fluorinated to magnesium fluoride, partially fluorinated or not fluorinated at all.

As used herein, the term "non-magnesium fluoride precursor" (also referred to as non-magnesium precursor) refers to an additional metal compound present in the fluorination reaction. Depending on the reaction conditions this compound may be completely fluorinated to magnesium fluoride, partially fluorinated or not fluorinated at all.

The second magnesium fluoride precursor and the non-magnesium fluoride precursor are both added additionally in a certain amount to the magnesium alkoxide present in the fluorination reaction. Both are also referred to as "additives", "metal additive" or "additive precursors".

In some embodiments, in addition to the before mentioned magnesium additive compound a further metal additive compound is present in certain amounts (see discussion below). In some embodiments, in addition to the before mentioned magnesium additive compound further magnesium additive compounds are present. In some embodiments, two or more metal additive compounds are present (see discussion below). In some embodiments, two or more metal additive compounds and two or more magnesium additive compounds are present. However, the sum of molar ratio of the magnesium additive(s) and the further metal additive(s) does not exceed an amount of 0.2 mole calculated per mole magnesium with respect to the first magnesium precursor.

In some embodiments, the salts of strong, volatile acids are selected from chloride, bromide, iodide, nitrate or triflate.

Addition of a Second Magnesium Fluoride Precursor:

The chemical principle behind the advantages conferred by addition of the additive(s) mentioned above appears to be the cleavage of the Mg—O—Mg-bonds that can not be attacked by HF under the fluorolytic sol-gel conditions. Addition of a metal salt of a strong acid such as HCl, e.g. MgCl$_2$, MgBr$_2$, MgI$_2$ or Mg(NO$_3$)$_2$ in small amounts (1 part chloride/halogenide/nitrate to 10-40 parts MgOR$_2$, or 1 part chloride/halogenide/nitrate to 5-20 parts MgOR$_2$) to the turbid suspension of the magnesium alkoxide leads to the formation of clear alkoxide solutions after HF-addition.

Technical magnesium alkoxides are always hydrolysed to a certain degree, leading to Mg—O—Mg-units being present in the material. These Mg—O—Mg units do not undergo reaction with HF under the conditions of the reaction (in dry solvents), thus preventing the formation of clear MgF$_2$-sols. Without wishing to be bound by theory, the inventors believe that upon addition of HF to a mixture of alkoxide and chloride, HF reacts preferentially with the chloride (or the salt of another strong acid), leading to release of HCl (or the other strong acid). The HCl or other acid then breaks the Mg—O—Mg-units. As a result, complete reaction can take place, resulting in the formation of clear MgF$_2$-sols.

In some embodiments, the molar amount of the second magnesium fluoride precursor is 1%, 2%, 3%, 4%, 5%, 6%, 7%, 8%, 9% or 10%.

In some embodiments, the second magnesium precursor (also referred to as an metal additive precursor) is present in an amount of
 0.2 mole (1:5) to 0.001 mole (1:1000) per mole magnesium,
 0.2 mole (1:5) to 0.01 mole (1:100) per mole magnesium,
 0.2 mole (1:5) to 0.04 mole (1:25) per mole magnesium,
 0.2 mole (1:5) to 0.08 mole (1:12.5) per mole magnesium,
 0.1 mole (1:10) to 0.01 mole (1:100) per mole magnesium,
 0.1 mole (1:10) to 0.04 mole (1:25) per mole magnesium, or
 0.01 mole (1:100) to 0.04 mole (1:25) per mole magnesium
with respect to the magnesium alkoxide.

In some embodiments, the second magnesium fluoride precursor is selected from the group of chloride, bromide, iodide, nitrate or triflate, in partricular from chloride or nitrate, more particularly from chloride.

In some embodiments, in addition to the before mentioned magnesium additive compound a further metal additive compound is present in certain amounts (see discussion below). However, the sum of molar ratio of the magnesium additive and the further metal additive does not exceed an amount of 0.2 mole calculated per mole magnesium with respect to the first magnesium precursor.

In some embodiments, the second magnesium fluoride precursor is $MgCl_2$. In one embodiment, the molar amount of $MgCl_2$ in relation to the amount of magnesium alkoxide is 1%, 2%, 3%, 4%, 5%, 6%, 7%, 8%, 9% or 10%.

In some embodiments, the same result is obtained by adding a catalytic amount, such as 1%, 2%, 3%, 4%, 5%, 6%, 7%, 8%, 9% or 10%, of a strong, volatile acid such as HCl-gas or concentrated hydrochloric acid (in the case of addition of concentrated acid in water, the restriction of water content of the reaction must be taken into account, see below). Different volatile acids can be employed instead of HCl, such as HBr, HI, $HNO_3$ and the like. The requirement for volatility is based on the subsequent use of the fluoride sol solution in formation of an optical layer. The volatility of the acid guarantees that the acid will be easily removed and not impact the optical, mechanical or chemical properties of the layer.

In some embodiments, trifluoroacetic acid (TFA) is added to the first volume or the second volume. The use of small amounts of TFA leads to shorter stirring times. By using TFA, the sol solutions clear faster. The inventor believes, without wishing to be bound by theory, that agglomeration products comprising a small amount of HF within the agglomeration products are generated intermediately. Thus, some parts of the magnesium precursor have not yet reacted with HF in a first phase of the reaction. A complete reaction with HF occurs when the HF diffuses into the agglomeration products and reacts with the remaining magnesium precursor, which leads to a clear sol solution. By adding small amounts of TFA, the TFA can react with the remaining magnesium precursor yielding a clear sol solution. The TFA-magnesium-intermediate can be transformed by heating (as will be described later) to $MgF_2$. If metal additives (in comparison to the reaction of only magnesium precursors) are additionally used, even less TFA is necessary in order to obtain a clear sol solution in a reasonable amount of time.

The magnesium salts (bromides, iodides, nitrates etc.) offer the advantage of leading to a similar degree of resolvation of the otherwise insoluble alkoxide while avoiding the technical drawbacks of handling liquid acids or their respective gases.

Addition of an Additive Non-Magnesium Fluoride Precursor:

Chlorides, bromides, iodides or other suitable salts of strong acids of metals different from magnesium, such as—by way of non-limiting example—lithium, antimony, tin, calcium, strontium, barium, aluminium, silicon, titanium, zirconium, or zink, may also be used, leading to additional synergistic effects both regarding the stability of the sol solution and the mechanical and optical qualities of the resultant layers.

In some embodiments, an additive non-magnesium fluoride precursor selected from the group of salts of strong, volatile acids, in particular from chloride, bromide, iodide, nitrate or triflate of lithium, antimony, tin, calcium, strontium, barium, aluminium, silicon, zirconium, titanium or zinc is present in the first volume.

In some embodiments, an additive non-magnesium fluoride precursor selected from the group salts of strong, volatile acids, in particular from chloride, bromide, iodide, nitrate or triflate of lithium, antimony, tin, calcium, strontium, barium, aluminium, silicon, zirconium, titanium or zinc is added after step b (the addition of the second volume).

The major advantage conferred by these additives is the faster clearing of the sols, their better stability against gelation and the improved mechanic and thermal stability of the layers obtained from such sols.

In some embodiments, the metal of the non magnesium fluoride precursor is $Li^+$, $Ca^{2+}$, $Sr^{2+}$, $Ba^{2+}$, $Sn^{2+}$, $Zn^{2+}$, $Al^{3+}$, $Si^{4+}$, $Ti^{4+}$, $Zr^{4+}$, Se, $Sb^{3+}$ or $Sb^{5+}$, in particular $Li^+$, $Ca^{2+}$, $Ti^{4+}$, $Al^{3+}$ or $Si^{4+}$.

In some embodiments, the at least one additive non-magnesium precursor is a chloride or a nitrate, in particular a chloride.

In some embodiments, the at least one additive non-magnesium precursor is a chloride, bromide or nitrate of lithium, antimony, tin, calcium, strontium, barium, aluminium, silicon, zirconium, titanium or zinc, in particular of lithium, calcium, silicon, titanium or aluminium, more particularly of calcium. In some embodiments, the at least one additive non-magnesium precursor is a chloride of lithium, calcium, silicon, titanium or aluminium.

In some embodiments, the non-magnesium precursor (also referred to as the metal additive precursor) is present in an amount of 0.2 mole (1:5) to 0.001 mole (1:1000) per mole magnesium,
0.2 mole (1:5) to 0.01 mole (1:100) per mole magnesium,
0.2 mole (1:5) to 0.04 mole (1:25) per mole magnesium,
0.2 mole (1:5) to 0.08 mole (1:12.5) per mole magnesium,
0.1 mole (1:10) to 0.01 mole (1:100) per mole magnesium,
0.1 mole (1:10) to 0.04 mole (1:25) per mole magnesium, or
0.01 mole (1:100) to 0.04 mole (1:25) per mole magnesium with respect to the magnesium alkoxide.

In some embodiments, the amount of additive non-magnesium fluoride precursor is 1%, 2%, 3%, 4%, 5%, 6%, 7%, 8%, 9%, 10%, 12%, 14%, 16%, 18% or 20% of the magnesium alkoxide, as measured in molar equivalents.

The major advantage conferred by these additives is the faster clearing of the sols, their better stability against gelation and the improved mechanic and thermal stability of the layers obtained from such sols.

In some embodiments, the additive non-magnesium fluoride precursor is $CaCl_2$. In one embodiment, the molar amount of $CaCl_2$ in relation to the amount of magnesium alkoxide is 1%, 2%, 3%, 4%, 5%, 6%, 7%, 8%, 9%, 10%, 12%, 14%, 16%, 18% or 20%.

In some embodiments, the second metal fluoride precursor is $Ca^{2+}$, $Sr^{2+}$, $Ba^{2+}$, $Al^{3+}$, $Si^{4+}$, $Ti^{4+}$, $Zr^{4+}$ or $Zn^{2+}$.

The $MgF_2$ sols of the invention are synthesized by reacting a solution of a suitable magnesium alkoxide, such as—by way of non-limiting example—magnesium methanolate (methylate), ethanolate (ethylate) or propanolate, in organic water-free solvents like alkohols, polyalcohols, ethers, esters, and mixtures thereof with anhydrous hydrogen fluoride (HF) in the presence of a second magnesium fluoride precursor and/or a non-magnesium fluoride precursor. The HF is provided in gaseous or in liquid form or as solution in a solvent as aforementioned. In one embodiment, the non-aqueous solvent is ethanol or isopropanol, in particular ethanol.

In one embodiment, the non-aqueous solvent is ethanol or isopropanol, in particular ethanol, and the precursor is magnesium ethylate.

Addition of Carbon Dioxide:

Additionally, carbon dioxide may be added to the reaction, further improving the solubility of the alkoxide precursor and the stability of the resultant sol solution. Again without wishing to be bound by theory, the inventors believe that the surprising advantage of using carbon dioxide derive from the fact that the addition of $CO_2$ to the suspension, particularly to an alkoholic suspension, causes a reaction of the acidic gas $CO_2$ with the basic Mg—O-bonds, resulting in the partial formation of an intermediate that might be formulated as a kind of magnesium alkylcarbonate, which under the invented circumstances is soluble, particularly in alcohols.

The same mechanism also applies to the intact magnesium alkoxide in those cases where the alkoxide is unsoluble in the respective solvent. One example of such pair is Mg ethoxide in ethanol. As a consequence, the insoluble magnesium ethoxide becomes converted not only into a soluble intermediate precursor but also becomes activated by formation of the above mentioned alkyl carbonate to undergo reaction with HF, thus leading to formation of clear $MgF_2$-sols.

Any imaginable addition of $CO_2$ is possible: In some embodiments, $CO_2$ is added as a gas. In some embodiments, $CO_2$ is added as a solid (dry ice). In some embodiments, $CO_2$ is added prior to the addition of HF. In some embodiments, $CO_2$ is added prior to the addition of HF and addition of $CO_2$ is continued while HF is added.

The temperature of the reaction in presence of $CO_2$ might be varied over a wide range from minus 60° C. up to at least +50° C. In any case clear solutions of the magnesium alkoxide, particularly ethoxide, will be obtained. The time until the suspension clears up will differ depending on the conditions. The $CO_2$-content may range widely, for example from 1 to 7 mass % $CO_2$ in relation to ethanol, or from 2 to 4%.

In some embodiments, gaseous carbon dioxide is carried through the first volume prior to adding the second volume comprising anhydrous hydrogen fluoride, thus, prior to the addition of HF. In one embodiment, the amount of carbon dioxide is adjusted in order for the first volume to reach a $CO_2$ content of between 1% and 5% (w/w), in particular to reach a $CO_2$ content of 3% (w/w). In one embodiment, the amount of carbon dioxide is adjusted in order for the first volume to reach a $CO_2$ content of between 1% and 4% (w/w).

In some embodiments, carbon dioxide is added to a dispersion of magnesium ethanolate in ethanol in a range between 1 to 4 Vol % in a temperature interval between −60° C. to +50° C. In some embodiments, the temperature selected is between 10° C. and 25° C. In some embodiments, carbon dioxide is added to a dispersion of magnesium ethanolate in ethanol in a range between 1% and 5% (w/w), in particular of 3% (w/w) in a temperature interval between −60° C. to +50° C. In some embodiments, the temperature selected is between 10° C. and 25° C.

In some embodiments, said magnesium alkoxide is partially hydrolysed, comprising Mg—O—Mg bonds. In some embodiments, said magnesium alkoxide is technical grade magnesium alkoxide. In some embodiments, said magnesium alkoxide is technical grade magnesium ethanolate.

The $MgF_2$ sols of the invention are synthesized by reacting a solution of a suitable magnesium alkoxide, such as—by way of non-limiting example—magnesium methanolate (methylate), ethanolate (ethylate) or propanolate, in organic water-free solvents like alkohols, polyalcohols, ethers, esters, and mixtures thereof with anhydrous hydrogen fluoride (HF) in the presence of carbon dioxide, a second magnesium fluoride precursor and/or a non-magnesium fluoride precursor. The HF is provided in gaseous or in liquid form or as solution in a solvent as aforementioned.

The method according to the invention differs from methods known in the art by carefully controlling the water content of the reaction volume (i.e., the water content of educt and its solvent, the water content of the HF added, and the amount of water resulting from the reaction and further reactions downstream, for example, from a reaction between additive ligand, and the solvent.

In some embodiments, the magnesium alkoxide is magnesium methoxide or magnesium ethoxide, and the reaction solvent is ethanol. Therein, the water content of the final sol solution is determined by the water content of the solvent, the water content of the magnesium alkoxide and the water content of the HF solution (if a solution is used, as is practical in order to adjust the amount of HF to an exact stoichiometric equivalent).

The method according to the invention does not rely on complete absence of water. The solvents used for preparing the first and second volume (in embodiments where HF is applied in solution) of the reaction do not have to be dried. In practice, the use of "absolute" solvents as supplied technically, having a water content of equal to or smaller than 0.2% (w/w) has been sufficient. Magnesium alkoxides such as magnesium methanolate or ethanolate were used as commercially obtained.

In some embodiments, the water content of the sol solution is equal to or lower than 2.8, 2.7, 2.6, 2.5, 2.4, 2.3, 2.2, 2.1, 2.0, 1.9, 1.8, 1.7, 1.6, 1.5, 1.4, 1.3, 1.2, 1.1, 1.0, 0.9, 0.8, 0.7, 0.6, 0.5, 0.4, 0.3, 0.2 or 0.1 mole water per mole magnesium. One limit observed in the experiments leading to the present invention was that the reaction must not exceed a water content of 3% (volume). In some embodiments, the water content of the first volume is equal to or lower than 3%, 2.75%, 2.5%, 2.25%, 2.0%, 1.75%, 1.5%, 1.25%, 1.0%, 0.75%, 0.5%, 0.25% or 0.1%.

In some embodiments, step b. is performed under vigorous stirring. In some embodiments, the stirring speed exceeds 100 rpm, 150 rpm, 200 rpm, 250 rpm or 300 rpm. In some embodiments, the stirring speed is in the range of 100 rpm to 1000 rpm, in particular 600 rpm to 1000 rpm. In some embodiments, the stirring speed exceeds 100 rpm, 200 rpm, 300 rpm, 400 rpm, 500 rpm, 600 rpm, 700 rpm, 800 rpm, 900 rpm or 1000 rpm, in particular the stirring speed exceeds 600 rpm, 700 rpm, 800 rpm, 900 rpm or 1000 rpm.

In some embodiments, the reaction volume resulting from the second volume being added to the first volume is stirred for 2 to 10 days, in particular for 2, 3, 4, 5, 6, 7, 8, 9 or 10 days. In some embodiments, the reaction volume resulting from the second volume being added to the first volume is stirred for 8 to 20 hours, in particular for 8, 12, 16 or 20 hours or 1 to 21 days, in particular for 1, 2, 3, 4, 5, 6, 7, 8, 9, 10, 11, 12, 13, 14, 15, 16, 17, 18, 19, 20, 21 days. The stirring time depends on the used reactants and conditions, wherein the stirring will be stopped after a clear sol solution is achieved.

One important parameter of the method according to the invention is the amount of HF being applied, the ideal amount being an exact stoichiometric equivalent (2 HF per Mg). Smaller amounts of HF will improve sol formation, however will lead to impaired mechanical and optical properties of the resulting coating. Larger amounts of HF lead to less stable sols or difficulties in sol formation. In general, amounts of HF exceeding 2 molar equivalents tend to favour crystalline rather than nanodisperse phases, leading to larger particle sizes and, eventually, precipitation.

In some embodiments, the amount of HF employed ranges from 1.9 mole to 2.1 mole HF per mole Mg. In some embodiments, the amount of HF employed ranges from 1.95 mole to 2.05 mole HF per mole Mg. In some embodiments, the amount of HF employed ranges from 1.98 mole to 2.02 mole HF per mole Mg. In some embodiments, the amount of HF employed ranges from 1.99 mole to 2.01 mole HF per mole Mg.

For embodiments employing the use of an additive non-magnesium fluoride precursor $XB_n$, and where providing sol solutions for optical surface coatings is the objective, the acid BH formed by the reaction $$XB_n + nHF \rightarrow XF_n + nBH$$

must be removed from the coating in order not to degrade its optical properties. The removal of the acid is easily effected by evaporation during the drying or first thermal treatment of the coating. Hence, for embodiments of the invention where removal of the acid formed from the magnesium precursors is essential, the magnesium precursor is the magnesium salt of an acid that is volatile at the conditions employed during drying and tempering, for example a precursor that is the salt of an acid that is volatile (has a vapour pressure allowing the removal of essentially all (>99%) of the acid from a 0.5 μm optical coating at ambient pressure) at a temperature of 30° C., 40° C., 50° C., 60° C., 70° C., 80° C., 90° C., 100° C., 125° C., 150° C., 175° C., 200° C., 225° C., 250° C., 275° C. or 300° C.

In some embodiments a temperature in the range of about 100° C. to 500° C., in particular of about 250° C. to 500° C. can be used. In some embodiments a temperature in the range of about 400° C. to 500° C. can be used. In some embodiments a temperature in the range of about 100° C. to 700° C. is used.

In some embodiments an additional amount of hydrogen fluoride ($n_{adHF}$) is present in the fluorination of step b computed according to the formula

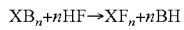

$n_{adHF} = (n_M * X_{additive}) * Ox * A$, wherein $n_M$ is the molar amount of said magnesium alkoxide,
$X_{additive}$ is the molar percentage of said second magnesium fluoride precursor or said non-magnesium fluoride precursor, wherein
  $X_{additive}$ is in the range of 1% to 20%, and
  Ox is the oxidation state of the metal of said second magnesium fluoride precursor or said non-magnesium fluoride precursor, and
  A is selected from $0 \leq A \leq 1$.

In some embodiments, a magnesium fluoride precursor and a non-magnesium fluoride precursor may be present in the fluorination reaction. In some embodiments two non-magnesium fluoride precursors may be present in the fluorination reaction. The amount of additional HF is calculated as discussed above for each additional precursor. For example if magnesium chloride and calcium chloride are present in the reaction the additional amount of HF is calculated for the magnesium chloride and the calcium chloride, respectively.

In some embodiments two non-magnesium fluoride precursors may be present in the fluorination reaction, wherein one of the two non-magnesium fluoride precursors is selected from the group of salts of strong, volatile acids, such as—by way of non-limiting example—a chloride, bromide, iodide, nitrate or triflate, in particular chloride or nitrate, and the other non-magnesium fluoride precursors is selected from the group comprising an alcoholate (RO—), a carboxylate (RCOO—), a carbonate, an alkoxycarbonate, a hydroxide or a salt selected from the group of salts of strong, volatile acids, such as—by way of non-limiting example— chloride, bromide, iodide, nitrate or triflate, in particular from alcoholate, nitrate or chloride.

In some embodiments a second magnesium fluoride precursor and a non-magnesium fluoride precursors may be present in the fluorination reaction, wherein the second magnesium fluoride precursors is selected from the group of salts of strong, volatile acids, such as—by way of non-limiting example—chloride, bromide, iodide, nitrate or triflate, in particular chloride or nitrate, and the non-magnesium fluoride precursors is selected from the group comprising an alcoholate (RO—), a carboxylate (RCOO—), a carbonate, an alkoxycarbonate, a hydroxide or a salt selected from the group of salts of strong, volatile acids, such as—by way of non-limiting example—chloride, bromide, iodide, nitrate or triflate, in particular from alcoholate, nitrate or chloride.

In some embodiments a second magnesium fluoride precursor and a further magnesium fluoride precursors may be present in the fluorination reaction, wherein the second magnesium fluoride precursors is selected from the group of salts of strong, volatile acids, such as—by way of non-limiting example—chloride, bromide, iodide, nitrate or triflate, in particular chloride or nitrate, and the further magnesium fluoride precursors is selected from the group comprising an alcoholate (RO—), a carboxylate (RCOO—), a carbonate, an alkoxycarbonate, a hydroxide or a salt selected from the group of salts of strong, volatile acids, such as—by way of non-limiting example—chloride, bromide, iodide, nitrate or triflate in particular from an alcoholate, nitrate or chloride, in particular from alcoholate, nitrate or chloride.

For the embodiment making use of non-magnesium fluoride precursors, the resulting additive fluoride particles are, to the extent that the inventors have been able to characterize these phases, may not be double salts of magnesium and additive, but rather distinct species, present in the sol as a mixture of single components (e.g. $MgF_2$ and the $MF_x$ additive). In some embodiments, the additive fluoride particles have a diameter size of smaller than (<) 100 nm, <75 nm, <50 nm, <40 nm, <30 nm, <20 nm or <10 nm. However, depending on the reaction conditions resulting additive fluoride particles may be double salts of magnesium and additive present in the sol as a mixture of double salt components.

In some embodiments, an amount of 1%, 2%, 3%, 4%, 5%, 6%, 7%, 8% or 10% (mol equ.) of tetraethoxysilane (TEOS) or tetramethoxysilane (TMOS) is added to the magnesium precursor solution or suspension, leading to more rapid sol formation than without the additive.

Addition of said non-magnesium fluoride precursors promotes the formation of mostly amorphous nano-$MgF_2$ particles that are even smaller than those obtained without non-magnesium fluoride precursors; thus resulting in an improved architectural ordering of the layer, and hence improved mechanical strength. Based on $^{19}F$-NMR spectra (cf. FIG. 2), characteristic patterns for the $MgF_2$ particles synthesized this way can be obtained, thus allowing distinction from MgF$_2$-materials obtained according different syntheses approaches.

If metal M$^{n+}$-additives (derived from the second magnesium precursor or the non-magnesium precursor) are used, the HF-stoichiometry related to the first Mg$^{2+}$-precursor ($n_{HF}/n_{Mg2+}$) can be varied between 1.6 up to 2.2. In some embodiments, the stoichiometric ratio of HF to magnesium precursor ($n_{HF}/n_{Mg2+}$) can be varied between 1.85 up to 2.05, in particular between 1.9 up to 2.05. In some embodiments, the HF stoichiometry will be fixed to exactly 2.0 in reference to the magnesium content of the first magnesium precursor. As long as stoichiometric amounts of HF are used ($n_{HF}/n_{Mg2+}$=2) formation of the other MF$_n$ (M$^{n+}$=Li$^+$, Mg$^{2+}$, Ca$^{2+}$, Sr$^{2+}$, Ba$^{2+}$, Sn$^{2+}$, Zn$^{2+}$, Al$^{3+}$, Si$^{4+}$, Ti$^{4+}$, Zr$^{4+}$, Sn$^{4+}$, Sb$^{3+}$ or Sb$^{5+}$) is suppressed as evidenced by NMR. In some embodiments, the HF stoichiometry will be fixed to exactly 2.0 in reference to the content of magnesium and additive, wherein the amount of fluoride that can react with the additive is computed according to the oxidation state of the additive.

Thus, for embodiments where magnesium precursors and additives according to the above definition are present and an exactly stoichiometric amount of 2 eq HF per magnesium with respect to the first magnesium precursor is used, only the first magnesium precursor will be fluorinated. The term "only the magnesium precursor will be fluorinated" refers to an essentially quantitative conversion of the magnesium precursor. It is possible that in some embodiments, traces of the magnesium precursor will not be fluorinated and traces of the additive can be partially or totally fluorinated, which may be due to an equilibrium in the sol reaction. However, these traces will be in the range off around 1 to 2 mol % related to MgF$_2$.

In some embodiments 2 eq HF are used and additionally a metal additive is added to the sol reaction without a further addition of HF. This allows a reaction of the metal additive with the remaining not reacted HF, as discussed above, yielding some partially fluorinated metal additives while removing the unreacted HF from the reaction mixture. It has to be noted, that some of the used metal additives (such as Si, Zr, Ti, Al or Sn additives) will not yield completely fluorinated compounds—regardless of the applied (stoichiometric) amount of HF.

In some embodiments, a magnesium precursor and a metal additive are used and essentially all of the magnesium and essentially the entire additive is fluorinated. Thus, in such embodiments, the HF stoichiometry is fixed to exactly 2.0 in reference to the content of magnesium plus an additional amount for the metal additive, wherein the additional amount of fluoride that can react with the additive is computed according to the oxidation state of the additive and the amount of the additive employed in the reaction. For example, if 200 mmol ZnCl$_2$ (as a metal additive) and 1 mol magnesium precursor are used, the amount of HF will be 2.4 mole. The addition of the metal additive compound before adding the HF solution allows a complete fluorination of the magnesium precursor and the metal additive compound. In some embodiments, trace amounts of non-fluorinated compounds (1-2% of the magnesium employed in the reaction) may persist in the sol thus formed, as discussed above. An analogue description applies if two or more different metal additives are used. In some embodiments, even with such a fixed HF stoichiometry only partially fluorinated additive compounds are observed.

In some embodiments, a magnesium precursor and metal additives are used and essentially all of the magnesium and some of the additive is fluorinated. Thus, in such embodiments, the HF stoichiometry is fixed to 2.0 in reference to the content of magnesium derived from the magnesium precursor employed in the reaction, plus an additional amount of HF, which is computed multiplying the oxidation state of the additive, the amount of the additive and the molar percentage of additive fluorination. Thus, according to the above example of 1 mol magnesium precursor and 200 mmol zinc, the stoichiometry of HF can be selected in the range from 2.0 mol HF (essentially no fluorination of the additive takes place) to 2.4 mol HF (essentially all of the additive is fluorinated). If the aim of the reaction is only a partial fluorination of the additive (e.g. of about 50% with reference to the above mentioned example), 2.2 mol HF will be applied. Depending on the amount of additive present in the reaction, the amount of HF for a potentially complete fluorination will be computed accordingly. For example, if 100 mmol ZnCl$_2$ and 1 mol of magnesium precursor will be used, the amount of HF can be selected in the range from 2.0 to 2.2 mole HF. The same applies for the oxidation state. A lower oxidation state amounts to a lesser amount of HF necessary for a complete fluorination, wherein a higher oxidation state amounts to a higher amount of HF. For example, if a Li$^+$-additive (200 mmol) is used (instead of the above mentioned ZnCl$_2$), the range of HF will be between 2.0 and 2.2 mol HF, however, if a Ti$^{4+}$-additive (200 mmol) is used, the range of HF will be between 2.0 and 2.8 mol HF. An analogue description applies for two or more additives.

In some embodiments, in particular if chloride is present, even if stoichiometric amounts of HF are used, not all of the used HF will react with the magnesium precursor. In such a case a further metal additive may be used, which will react with the unreacted HF, yielding some partially fluorinated additive compounds while removing the remaining HF from the sol reaction. The inventors believe, without wishing to be bound by this theory, that unreacted HF may cause an inferior wettability of the sol, which generally occurs after a few days, in comparison to other sols according to the invention comprising no or less unreacted HF.

Thus, the HF stoichiometry can be fixed to 2.0 in reference to the content of magnesium derived from the magnesium precursor ($n_{Mg}$) used in the reaction, plus an additional amount of HF ($n_{adHF}$) according to the following formula:

$$n_{HF}=2*n_{Mg}+n_{adHF}.$$

The HF stoichiometry for the additive can be computed according to the oxidation state (Ox) of the additive and the amount of the additive and the selected degree of fluorination of said additive (A). The additional amount of HF ($n_{adHF}$) can be computed according to the following formula:

$$n_{adHF}=(n_{Mg}*X_{additive})*Ox*A,$$

wherein $n_{Mg}$ is the amount of magnesium precursor, $X_{additive}$ is the molar percentage of said metal additive precursor (second magnesium precursor or non-magnesium precursor) in relation to said molar amount of said first magnesium precursor, Ox is the oxidation state of the metal of the additive and A is selected from 0≤A≤1.

In some embodiments, A is 0, yielding essentially unfluorinated metal additive compounds and no additional HF is applied. In some embodiments, in cases of an incomplete reaction of the stoichiometric amount of HF and the magnesium precursor, A is 0 and no additional HF is applied, yielding unfluorinated and partially fluorinated metal additive compounds, thus, removing or "neutralizing" the unreacted amount of HF. In some embodiments, A is 1, yielding essentially completely fluorinated metal additive compounds. In some embodiments, A is 0<A<1, yielding partially fluorinated metal additive compounds.

Depending on the metal of the additive used, the oxidation state of said metal, the amount of HF applied and the reaction conditions, the additive can be completely fluorinated, leading to $MF_x$ additives. Alternatively, parts of the additive can be completely fluorinated, leading to $MF_x/MB_x$ mixtures of the additive as well as partially fluorinated additives $MF_mB_{x-m}$ or mixtures thereof (e.g. $MF_mB_{x-m}/MB_x$ or $MF_x/MF_mB_{x-m}/MB_x$), wherein x is equal to the oxidation state of the metal and m is equal to or smaller than the oxidation state and B is selected from the group comprising an alcoholate (RO—), a carboxylate (RCOO—), a carbonate, an alkoxycarbonate, a hydroxide or selected from the group of salts of strong, volatile acids, such as—by way of non-limiting example—chloride, bromide, iodide, nitrate or triflate, particularly alcoholate, nitrate or chlordide. In some embodiments, B is selected from chloride, methanolate, ethanolate, propoxylate, buthylate, chloride or nitrate The partially fluorinated additives $MF_mB_{x-m}$ can comprise of identical fluorinated additives (e.g. only one residue is exchange by fluoride in the metal additive) as well as partially fluorinated additives in different states of fluorination (e.g. in some additive particles one residue is exchange by fluoride in the metal additive and in other additive particles two residues are exchanged or other possible combinations). Similar arguments apply if a magnesium additive, as discussed above, is used and the amount of HF is stoichiometric (2 eq HF) or less (e.g. 1.85 to 1.95 eq HF).

In some embodiments, the metal additive compound is selected from the group of $CaCl_2$, $MgCl_2$, $Ca(OEt)_2$, $LiCl$, $C_8H_{20}O_4Si$, $Ti(O^iPr)_4$, $Al(O^iPr)_3$, $AlCl_3$, $TiCl_4$ and/or $SiCl_4$.

Clear sols with small $MgF_2$-particles between 3 and 10 nm are obtained routinely when the alkoxides are fully soluble in the non-aqueous solvent, that is when clear alkoxide solutions are obtained. Starting from dispersed precursor systems often does not result in the formation of clear sols. Opaque or non-transparent sols do not give high performance AR-layers. Dispersed precursor systems however have been found to clear quickly and render truly nanodisperse sol solutions when additive precursors as indicated in the previous paragraphs are employed.

First Volume:

A large number of solvents offer themselves for practicing the invention. In some embodiments, the non-aqueous solvent is an alcohol such as, by way of non-limiting example, methanol, ethanol or isopropanol. In some embodiments, the non-aqueous solvent is a polyalcohol such as, by way of non-limiting example, polyethylene glycol. In some embodiments, the non-aqueous solvent is an ether such as, by way of non-limiting example, dietyl ether, methyl tert-butyl ether or tetrahydrofurane. In some embodiments, the non-aqueous solvent is an ester. In some embodiments, the non-aqueous solvent is a mixture of any of the previously cited solvents.

For embodiments that aim at providing technical scale quantities, the solvent needs to be available at low price. Since methanol is toxic, handling and operation of the sol formation itself and its downstream applications in surface coatings require additional safety measures. For large scale applications, some embodiments of the process of the invention employ ethanol or isopropanol as a solvent in particular ethanol, as a solvent. For such applications, embodiments of the process of the invention are preferred in which ethanol or isopropanol can be used as a solvent. The method according to the present invention offers the great advantage of providing sol solutions that are particularly stable in ethanol even at high concentrations. In some embodiments—using ethanol or isopropanol as a solvent—the solution has a magnesium content in the range of about 0.2 mol/L to 0.8 mol/L, in particular of about 0.2 mol/L to 0.6 mol/L. In some embodiments using ethanol or isopropanol, in particular ethanol, as a solvent the solution has a magnesium content in the range of about 0.2 mol/L to 0.4 mol/L. In some embodiments, the magnesium content is 0.2 mol/L, 0.3 mol/L, 0.4 mol/L, 0.5 mol/L, 0.6 mol/L, 0.7 mol/L or 0.8 mol/L.

In some embodiments, the magnesium precursor is magnesium methylate. In one embodiment, the non-aqueous solvent is ethanol or isopropanol. In one embodiment, the non-aqueous solvent is ethanol or isopropanol and the precursor is magnesium ethylate.

An important distinction of embodiments making use of additives is the fact that the additive precursor may be added during the fluorination step, i.e. along with the magnesium alkoxide precursor. The inorganic acids produced during the fluorination step result in a faster clearing of the sol solution. In some embodiments making use of additives the additive precursor may be added after the fluorination step of the first magnesium precursor. In some embodiments, the additive precursor is present in an amount of 0.2 mole (1:5) to 0.01 mole (1:100) per mole magnesium alkoxide.

Among the alcohol-magnesium alcoholate systems, magnesium methylate is soluble in methanol only, and the ethylate does not lead to clear solutions suitable to generation of fluoride sols in any alcohol, according to the observation of the present inventors. The method of the present invention therefore provides an alternative route to the acetate process commonly employed to obtain $MgF_2$ sol solutions for coating purposes. Even this acetate route uses methanol. The present invention in contrast provides a process that facilitates the use of ethanol and magnesium ethoxide, as one example, leading to commercially and technically important improvements in the process of obtaining sol solutions for coating.

In some embodiments, the concentration of the magnesium alkoxide in the first volume is 0.1 mol/l, 0.2 mol/l, 0.3 mol/l, 0.4 mol/l, 0.5 mol/l, 0.6 mol/l, 0.7 mol/l, 0.8 mol/l, 0.9 mol/l, 1.0 mol/l, 1.2 mol/l, 1.3 mol/l, 1.4 mol/l or 1.5 mol/l.

Second Volume:

In some embodiments, the HF is added in liquid solution. In some embodiments, the HF solution has a concentration of 0.5 mol/l, 1 mol/l, 2 mol/l, 3 mol/l, 4 mol/l, 5 mol/l, 6 mol/l, 8 mol/l, 10 mol/l, 15 mol/l, 20 mol/l, 25 mol/l or 30 mol/l.

In some embodiments, the required HF is added in solution during 5 min to 60 min under intense stirring while keeping the temperature at or below 35° C.

In some embodiments, the HF is added as a gas.

According to a second aspect of the invention, a magnesium fluoride sol solution obtainable by a method according to the first or second aspect of the invention is provided. As an alternative of this second aspect of the invention, a magnesium fluoride sol solution comprising $MgF_2$ particles in a non-aqueous solvent is provided. The magnesium fluoride sol solution of the invention is characterized by a particle diameter size of smaller than (<) 100 nm, <75 nm, <50 nm, <40 nm, <30 nm, <20 nm or <10 nm. In some embodiments, the magnesium fluoride sol solution is constituted by nanoscopic scale $MgF_2$ particles with particle sizes ranging from 3 to 60 nm. In some embodiments, the particle size ranges from 3 to 20 nm, in particular 3 to 15. In some embodiments, the particle size ranges from 3 to 10 nm.

The resulting additive fluoride particles may not be double salts of magnesium and additive, but rather distinct species, present in the sol as a mixture of single components ($MgF_2$ and the $MF_x$ additive or $MgF_2$ and the $MB_x$ or additive, respectively). In some embodiments, the additive fluoride particles have a diameter size of smaller than (<) 50 nm, <40 nm, <30 nm, <20 nm, <10 nm, <5 nm, <4 nm or <3 nm. In some embodiments, the additive fluoride particles have a particle diameter size of smaller than (<) 20 nm, 15 nm, <10 nm, <7 nm, <5 nm, <4 nm, or <3 nm. The same applies if more than two metal components are used.

Depending on the reaction conditions resulting additive fluoride particles may be double salts of magnesium and additive present in the sol as a mixture of double salt components ($MgF_2/MF_x$ additive or $MgF_2/MB_x$ or $MF_mB_{x-m}$ additives, respectively, as discussed above). In some embodiments, the double salt component particles have a diameter size of smaller than (<) 50 nm, <40 nm, <30 nm, <20 nm, <10 nm, <5 nm, <4 nm or <3 nm. In some embodiments, the double salt component particles have a particle diameter size of smaller than (<) 20 nm, 15 nm, <10 nm, <7 nm, <5 nm, <4 nm, or <3 nm. The same applies, if more than two metal components are used, yielding multiple salt components.

In some embodiments, the sol reaction results in a mixture of the single component particles and the double (multiple) salt particles with the parameters as discussed above.

The particle size can be adjusted by varying the parameters of the process according to the first or second aspect of the invention. Formation of smaller particles is favored at temperatures between 20° C. and 30° C., slow addition of HF (over 30 to 60 minutes) and very high speeds of stirring (300 rpm). In some embodiments a stirring of about 600 to 1000 rpm is applied. Lower temperatures or slower stirring will generally favor formation of larger particles.

In some embodiments, said $MgF_2$ particles are smaller than 10 nm in a non-aqueous solvent, and the sol comprises additive particles, which are smaller than 50 nm in diameter.

The solvent may be selected as discussed above in respect to the method of the invention.

In some embodiments, the non-aqueous solvent is methanol, ethanol or isopropanol. In some embodiments, the non-aqueous solvent is methanol. In some embodiments, the non-aqueous solvent is ethanol or isopropanol. In some embodiments, the non-aqueous solvent is ethanol.

The sol solution of the invention is characterized by the presence of molecular species formed by the reaction of HF with the reactive magnesium precursor. Thus, to the extent that Mg—O—Mg complexes were present prior to addition of carbon dioxide, alkoxycarbonic acid is a characteristic component of the sol solution.

To the extent that a second magnesium fluoride precursor was present in the first volume, the corresponding acid, such as by way of non-limiting example, HCl, HBr or HI, will be present in the sol solution. If a non-magnesium precursor was present, a broader range of anions can be employed, leading to different reaction products (corresponding acids) such as acetates or lactates. These in turn will go on to react with the solvent, if the solvent is an alcohol, to form the corresponding esters. Acetates are esterified to a great extent (almost 100%), whereas lactates esterify only to about 30%.

In some embodiments, the magnesium fluoride sol solution of the invention is characterized by a solution comprising an amount of $MgF_2$ particles and, additionally, an amount of additive particles, derived from a magnesium additive and/or a metal additive (as described above), characterized by a general formula $MF_mB_{x-m}$, wherein $M^{n+}$ is selected from the group of $Li^+$, $Mg^{2+}$, $Ca^{2+}$, $Ca^{2+}$, $Sr^{2+}$, $Ba^{2+}$, $Sn^{2+}$, $Zn^{2+}$, $Al^{3+}$, $Si^{4+}$, $Ti^{4+}$, $Zr^{4+}$, $Sn^{4+}$, $Sb^{3+}$ or $Sb^{5+}$, B is an anionic ligand to M, x is equal to the oxidation state of the metal M and m is equal to or smaller than the oxidation state of the metal M. In some embodiments, B is selected from the group of strong, volatile acids, such as—by way of non-limiting example—a chloride, bromide, iodide, nitrate or triflate. In some embodiments, B is selected from chloride or nitrate, in particular chloride.

In some embodiments, the sol solution comprises essentially only fully fluorinated additive particles, wherein essentially all ligand B has been exchanged for fluoride, in other words, the additive component of the sol solution is characterized by a formula $MF_x$, with x equal to the oxidation state of the metal M.

In some embodiments, the sol solution comprises essentially only partially fluorinated additive particles, wherein some but not all of ligand B has been exchanged for fluoride, in other words, the additive component of the sol solution is characterized by a formula $MF_mB_{x-m}$, with m being in the range of 0<m<x. In some such embodiments, m is 0.1 x, 0.2 x, 0.3 x, 0.4 x, 0.5 x, 0.6 x, 0.7 x, 0.8 x, or 0.9 x. In some embodiments, m is in the range of 0<m<x, wherein x is the oxidation state of the metal M and m and x are natural numbers.

In some embodiments, the sol solution may comprise also some unfluorinated magnesium particles, as discussed above. An example of such an unfluorinated additive particle is $MgCl_2$, which is due to an incomplete reaction of HF with the $MgCl_2$ precursor (optionally a "neutralisation" of the remaining HF by adding a metal additive, as described above may be applied). The amount of such unfluorinated magnesium precursors is around 1 to 2% in relation to the amount of used magnesium precursor. Additionally the amount of unfluorinated magnesium precursors may be elevated by using less than a stoichiometric amount of HF.

In some embodiments, the sol solution comprises essentially only non-fluorinated additive particles, wherein essentially none of ligand B has been exchanged for fluoride, in other words, the additive component of the sol solution is characterized by a formula $MB_x$.

In some embodiments, the sol solution comprises fully fluorinated additive particles and/or partially fluorinated additive particles and/or non-fluorinated particles in a combination. Additionally partially fluorinated first magnesium precursor particles and non-fluorinated first magnesium precursor particles may be present.

In some embodiments, the sol solution comprises $MgF_2$ particles and $MB_x$ metal additive particles, wherein M is selected from the group of $Li^+$, $Mg^{2+}$, $Ca^{2+}$, $Sr^{2+}$, $Ba^{2+}$, $Sn^{2+}$, $Zn^{2+}$, $Al^{3+}$, $Si^{4+}$, $Ti^{4+}$, $Zr^{4+}$, $Sn^{4+}$, $Sb^{3+}$ or $Sb^{5+}$, and B is an anionic ligand, and x is equal to the oxidation state of the metal M. B can be selected from the group of salts of strong, volatile acids, such as—by way of non-limiting example—chloride, bromide, iodide, nitrate or triflate, in particular chloride or nitrate. In some embodiments, $M^{n+}$ is selected from the group comprising $Li^+$, $Mg^{2+}$, $Ca^{2+}$, $Al^{3+}$, $Si^{4+}$ or $Ti^{4+}$.

In some embodiments, the sol solution comprises $MgF_2$ particles and $MF_x$ metal additive particles, wherein M is selected from the group of $Li^+$, $Mg^{2+}$, $Ca^{2+}$, $Sr^{2+}$, $Ba^{2+}$, $Sn^{2+}$, $Zn^{2+}$, $Al^{3+}$, $Si^{4+}$, $Ti^{4+}$, $Zr^{4+}$, $Sn^{4+}$, $Sb^{3+}$ or $Sb^{5+}$, and B is an anionic ligand, and x is equal to the oxidation state of the metal M. In some embodiments, $M^{n+}$ is selected from the group comprising $Li^+$, $Mg^{2+}$, $Ca^{2+}$, $Al^{3+}$, $Si^{4+}$ or $Ti^{4+}$.

In some embodiments, the magnesium fluoride sol solution of the invention comprises $MgF_2$ particles and an amount of additive particles of the formula $MF_mB_{x-m}$, wherein $M^{n+}$ is selected from the group comprising $Li^+$, $Mg^{2+}$, $Ca^{2+}$, $Sr^{2+}$, $Ba^{2+}$, $Sn^{2+}$, $Zn^{2+}$, $Al^{3+}$, $Si^{4+}$, $Ti^{4+}$, $Zr^{4+}$, $Sn^{4+}$, $Sb^{3+}$ or $Sb^{5+}$, wherein x is equal to the oxidation state of M, m is equal to or smaller than x, B is selected from the group of salts of strong, volatile acids, such as—by way of non-limiting example—chloride, bromide, iodide, nitrate or triflate, in particular chloride or nitrate. In some embodiments, $M^{n+}$ is selected from the group comprising $Li^+$, $Mg^{2+}$, $Ca^{2+}$, $Al^{3+}$, $Si^{4+}$ or $Ti^{4+}$.

The sol solution comprising fully fluorinated, partially fluorinated or non-fluorinated additive particles $MF_mB_{x-m}$ can be provided by a method as described above, using no additional amount of HF, an additional amount of HF ($n_{adHF}$) or using a stoichiometric amount of HF with respect to the applied magnesium precursor (see the discussion above concerning essentially quantitative conversion of the additive). The sol solution can comprise, depending on the conditions applied, only $MB_x$, $MF_x$ or $MF_mB_{x-m}$ additives as well as mixtures thereof. (e.g. $MF_mB_{x-m}/MB_x$ or $MF_x/MF_mB_{x-m}/MB_x$).

Where a particular application requires, the properties of the $MgF_2$-layers can be adjusted regarding their mechanical and/or optical properties by introducing further $M^{n+}$-additives (by way of non-limiting example, $M^{n+}=Ca^{2+}$, $Sr^{2+}$, $Ba^{2+}$, $Zn^{2+}$, $Al^{3+}$, and $Si^{4+}$) directly to the $Mg^{2+}$-precursor solution. Surprisingly, if these precursors are added to the $Mg^{2+}$-precursor solution before adding the requested stoichiometric amount HF, the sols clear more quickly and resulting $MgF_2$-layers show significantly improved and distinctly different properties as compared to the post addition of e.g. $CaF_2$-, $SrF_2$-, $AlF_3$-, or $SiO_2$-particles to the synthesized pure $MgF_2$-sol. In some embodiments, the magnesium fluoride sol solution of the invention comprises an amount of additive particles selected from the group comprising $CaF_2$, $SrF_2$, $BaF_2$, $AlF_3$, $SiF_4$, $ZrF_4$, $TiF_4$, and/or $ZnF_2$. In some embodiments, the sol solution comprises $MgF_2$ particles and an amount of additive particles selected from the group comprising LiF, $CaF_2$, $SrF_2$, $BaF_2$, $SnF_2$, $AlF_3$, $SbF_3$, $SbF_5$, $ZrF_4$, and/or $ZnF_2$. In some embodiments, the amount of said additive particles, in relation to the amount of $MgF_2$ particles, is 1:5 to 1:500, as measured in molar equivalent of additive to magnesium.

The inventor believes that the prior addition of the metal additive compound—before adding the requested stoichiometric amount HF—positively influences the seed crystal and particle generation, leading to better dispersion of the non-magnesium additives.

Where a particular application requires, the properties of the $MgF_2$-layers can be adjusted regarding their mechanical and/or optical properties by introducing further metal additives (see preceding section), by the method described above. If these metal additive compounds are added to the magnesium precursor after adding the requested stoichiometric amount of HF and no additional amount of HF or an additional amount of HF, which is less than the stoichiometric amount with respect to the amount of metal additive (see discussion concerning a partially fluorinated additive) the resulting $MgF_2$-layers show significantly improved and distinctly different properties as compared to a solution where metal additives are added before HF is added to the sol reaction. Thus, even better results can be obtained, if the metal additives are added after adding the requested stoichiometric amount of HF.

The inventors believe, without wishing to be bound by this theory, that this is due to a higher amount of a free electrolyte concentration and the reaction of eventually unreacted HF (as discussed) with the metal additive, which leads to a stabilization of the particles in the sol.

In some embodiments, the sol solution is obtained according to a method described according to the first or second aspect of the invention, wherein the metal additive is added after the fluorination with HF (computed according to the amount of magnesium precursor).

In some embodiments, the magnesium fluoride sol solution of the invention comprises an amount of additive particles selected from the group comprising $CaCl_2$ $MgCl_2$, $Ca(OEt)_2$, LiCl, $C_8H_{20}O_4Si$, $Ti(O^iPr)_4$, $Al(O^iPr)_3$, $AlCl_3$, $TiCl_4$ and/or $SiCl_4$, or partially fluorinated particles thereof.

In some embodiments, said amount of metal additive particles (derived from non-magnesium additives or second magnesium additives, as described above) in the sol solution is 1:5 to 1:100, as measured in molar equivalent of additive to magnesium precursor. Thus, the metal additive compound is present in an amount of 0.2 mole (1:5) to 0.01 mole (1:100) per mole to magnesium precursor. In some embodiments, the metal additive compound is present in an amount of 0.2 mole (1:5) to 0.04 mole (1:25) per mole to magnesium precursor. In some embodiments, the metal additive compound is present in an amount of 0.2 mole (1:5) to 0.08 mole (1:12.5) per mole to magnesium precursor. In some embodiments, the metal additive compound is present in an amount of 0.1 mole (1:10) to 0.04 mole (1:25) per mole to magnesium precursor. In some embodiments, the metal additive compound is present in an amount of 0.04 mole (1:25) to 0.01 mole (1:100) per mole to magnesium precursor. This applies also for essentially completely fluorinated, partially fluorinated or essentially unfluorinated metal additives.

It is understood that the sol may comprise in particular the specified compounds and specified amounts of these compounds as described in the embodiments concerning the method for obtaining a magnesium sol.

In some embodiments, said additive particles are smaller than 50 nm in diameter.

In some embodiments, said $MgF_2$ particles are smaller than 10 nm in a non-aqueous solvent, and said sol comprises additive particles, which are smaller than 50 nm in diameter.

In some embodiments, said sol comprises double salts of $MgF_2$ particles and additive particles, which are smaller than 50 nm in diameter.

An important parameter in handling nanoparticle sol solutions for industrial applications is the concentration of the solution, with higher concentrations allowing more options to the user. High concentrations additionally lead to lower costs in transporting and storing the solution prior to its use. The sol solutions of the invention show distinctly greater stability at high concentrations when compared to sol solutions of the art.

In some embodiments, the magnesium fluoride sol solution of the invention has a magnesium content of larger than (>) 0.2 mol/l, 0.4 mol/l, 0.5 mol/l, 0.6 mol/l, 0.7 mol/l, 0.8 mol/l, 0.9 mol/l, 1.0 mol/l.

The concentration of the $MgF_2$-sol can range from 0.05 to 1 mol/l. In some embodiments, the concentration is between 0.15 and 0.5 mol/l. In some embodiments, the magnesium fluoride sol solution of the invention has a magnesium content of 0.6 mol/L. In some embodiments, the magnesium fluoride sol solution using ethanol or isopropanol, particularly ethanol, of the invention has a magnesium content in the range of about 0.2 mol/L to 0.8 mol/L, in particular of about 0.2 mol/L to 0.6 mol/L. In some embodiments, the magnesium fluoride sol solution using ethanol or isopropanol of the invention has a magnesium content in the range of about 0.2 mol/L to 0.8 mol/L, in particular 0.2 mol/L to 0.4 mol/L.

In some embodiments, the dynamic viscosity of the sol solution is in the range of 1.0 to 8.0 mPa s, in particular in the range of about 1.3 to 3.5 mPa s.

To some extent, the maximum concentration of the sol solution has been found to depend on the educt components. One particularly stable sol is obtained by reacting magnesium methylate or ethylate in methanol, ethanol or isopropanol, wherein solutions up to 1 mol/l can be obtained and stored without losing the distinct clarity of the solution over many months.

In some embodiments, the magnesium fluoride sol solution of the invention is stable at room temperature (20° C.) for more than 10 weeks.

Such stability is of advantage not only because gelling of the sol solution (which is generally irreversible) leads to material loss, but also because the recipients used to store the gelled solution need to be cleaned, which can be a laborious and expensive task.

According to a third aspect of the invention, a method for coating a surface is provided, comprising the steps of
 a. providing a magnesium fluoride sol solution;
 b. contacting the surface with the magnesium fluoride sol solution;
 c. drying said surface; and
 d. exposing said surface in a first thermal step to a first temperature ranging from 15° C. to 500° C., in particular 200 to 500° C.

In some embodiments, a method for coating a surface is provided, comprising the steps of
 a. providing a magnesium fluoride sol solution;
 b. contacting the surface with the magnesium fluoride sol solution;
 c. drying said surface; and
 d. exposing said surface in a first thermal step to a first temperature ranging from 15° C. to 100° C.

The magnesium fluoride sol solution has been obtained, or has the qualities of a sol solution that can be obtained, by a method according to the first or second aspect of the invention. Alternatively, a sol solution having the qualities described above is employed.

A number of methods of applying the sol solution to the surface offer themselves. In some embodiments, the coating is applied by spin coating or by dip-coating. In some embodiments, the coating is applied by spraying. The person skilled in the art will recognize the most suitable process of application depending on the shape of the substrate surface to be coated.

In some embodiments, the dynamic viscosity of the sol solution is in the range of 0.8 until 5.0 mPa s, in particular in the range pf 1.3 to 3.5 mPa s.

The drying and first thermal step allow for the removal of solvent and residual non-fluoridic components of the sol solution, mainly the acid formed by reacting of the precursor compound(s) with HF, or any subsequent reaction products derived thereof, such as esters.

Depending on the compounds used in making the sol solution, the requirements for time and temperature of the process will vary from room temperature (20° C.) to temperatures higher than 100° C., and from a few minutes to several hours. In one embodiment, the first thermal step proceeds between 250 and 500° C. for 5 to 30 min. In some embodiments, the first thermal step proceeds at between 300 and 400° C. for 5 to 30 min. In all cases the thermal treatment can be performed at ambient pressure.

In some embodiments, the drying takes place during the time interval between applying the coating on the surface and exposing the surface to a thermal step (e.g. the time between removal of the surface from the sol solution after dipping the surface in the sol solution and bringing the surface to an application for exposing the surface to thermal step). The drying allows for the removal of a large part of solvent and residual components of the sol solution, however, not all these components can be removed completely. Some will remain under these conditions in pores of the coating. The aim of the drying is to provide a smear-resistant coating.

In some embodiments, the drying step occurs for 10 min at room temperature.

In some embodiments, a thermal step is applied, wherein said surface is exposed to a temperature ranging from 100° C. to 500° C. In some embodiments a temperature in the range of about 250° C. to 500° C. is used. In some embodiments a temperature in the range of about 400° C. to 500° C. is used. This thermal step may be employed to sinter the coating, leading to improved mechanical stability.

In some embodiments, the thermal step will be applied to the surface in such a way that the surface is directly exposed to the necessary temperature, e.g. the surface is exposed to 450 C. Alternatively the surface can be exposed to a slowly increasing temperature interval until the necessary temperature (e.g. 450° C.) is reached. Alternatively higher temperatures may be applied if necessary. In some embodiments, the thermal step has a duration of 5 to 30 min. In all cases these thermal treatment can be performed at ambient pressure. In some embodiments, the thermal step (at a temperature of 450° C.) has a duration of 15 min. In some embodiments, the coating is allowed to cool down slowly over longer period of time (preferential between 100 and 150 min). The slow cooling of the heated coating will result in better characteristics concerning the mechanical properties of the coating. In some embodiments, the surface is exposed after the drying and prior to the thermal step to an additional drying temperature, wherein said surface is exposed to a drying temperature ranging from 15° C. to 100° C. for a certain amount of time.

The drying and first thermal step allow for the removal of solvent and residual non-fluoridic components of the sol solution, mainly the acid formed by reacting of the precursor compound(s) with HF, or any subsequent reaction products derived thereof, such as esters. Depending on the compounds used in making the sol solution, the requirements for time and temperature of the process will vary from room temperature to temperatures higher than 100° C., and from a few minutes to several hours. The drying and the additional drying temperature allow for the removal of a large part of solvent and residual components of the sol solution, however, not all these components can be removed completely. Some will remain under these conditions in pores of the coating. The aim of the drying and the additional drying temperature is to provide a smear-resistant coating.

In some embodiments, 80° C. is used for the additional drying temperature which occurs for 10 min.

In one embodiment, the first thermal step proceeds between 250 and 500° C. for 5 to 30 min. In some embodiments, the first thermal step proceeds at between 300 and 400° C. for 5 to 30 min. In all cases the thermal treatment can be performed at ambient pressure.

In some embodiments, after the first thermal step, a second thermal step is applied wherein said surface is exposed to a second temperature ranging from 250° C. to 500° C. This second thermal step may be employed to sinter the coating, leading to improved mechanical stability.

In some embodiments, one thermal post-treatment is applied after depositing the MgF$_2$-layer.

In some embodiments, a two-step thermal process is applied, wherein the substrate is treated in a first thermal step between room temperature and 100° C., and in a second thermal step at between 200 and 500° C. In some embodiments, the first thermal step has a duration of 5 to 60 min. In some embodiments, the second thermal step has a duration of 5 to 30 min. In one embodiment, a two-step thermal process has a first thermal step between 70° C. and 90° C. for 5 to 60 min, and a second thermal step between 250° C. and 500° C. for 5 to 30 min. In some embodiments, the second thermal step proceeds at between 300° C. and 400° C. for 5 to 30 min. In all cases the thermal treatment can be performed at ambient pressure.

In some embodiments, after the additional drying temperature, the thermal step is applied (two-step thermal process), wherein said surface is exposed to a temperature ranging from 100° C. to 500° C. In some embodiments the temperature of the thermal step is in the range of about 250° C. to 500° C. In some embodiments, a temperature in the range of about 400° C. to 500° C. is used for the thermal step. This thermal step may be employed to sinter the coating, leading to improved mechanical stability.

In some embodiments, the thermal step will be applied separately after the additional drying temperature. It is thus possible to allow for a cooling of the coating after the additional drying temperature. In some embodiments, the thermal step will be applied directly after the application of the additional drying temperature, thus, no cooling of the coating is allowed until after the thermal step is finished. In some embodiments, the thermal step will be applied directly after the additional drying temperature, wherein the coating is heated slowly until the necessary end temperature is reached (e.g. 450° C.).

In some embodiments, the additional drying temperature exposure has a duration of 5 to 60 min. In some embodiments, the thermal step has a duration of 5 to 30 min.

In some embodiments, a two-step thermal process is applied, wherein the substrate is treated in a first thermal step between room temperature and 100° C., and in a second thermal step at between 200° C. and 500° C. In some embodiments, the first thermal step has a duration of 5 to 60 min. In some embodiments, the second thermal step has a duration of 5 to 30 min. In one embodiment, a two-step thermal process has a first thermal step between 70 and 90° C. for 5 to 60 min, and a second thermal step between 250° C. and 500° C. for 5 to 30 min. In some embodiments, the second thermal step proceeds at between 300° C. and 400° C. for 5 to 30 min. In all cases the thermal treatment can be performed at ambient pressure. In some embodiments, the additional drying temperature exposure (temperature 80° C.) has a duration of 10 min, wherein the thermal step (at a temperature of 450° C.) has a duration of 15 min. In some embodiments, the coating is allowed to cool down slowly over longer period of time (preferential between 100 and 150 min). The slow cooling of the heated coating will result in better characteristics concerning the mechanical properties of the coating.

In some embodiments, the substrate is heated slowly (2 K to 5 K per min), held isothermically for 10 to 45 min and is cooled subsequently at a similar rate (2 K to 5 K per min). This treatment has shown particularly satisfactory results as regards mechanic stability.

Any of the sol solutions provided herein will result in porous and mechanically robust layers that can be obtained in just a single coatings step.

According to a fourth aspect of the invention, a surface coating comprising magnesium fluoride nanoparticles is provided. This coating may be characterized by its constituent particles' size, its porosity, optical qualities and/or scratch resistance.

In some embodiments, the surface coating of the invention is characterized by a refractivity index between $n_{500}=1.21$ and $n_{500}=1.32$. In some embodiments, the surface coating of the invention is characterized by a porosity of 30 to 50%. In some embodiments, the surface coating of the invention is characterized by a porosity of 40 to 55%. In some embodiments, the surface coating of the invention is characterized by a refractivity index between $n_{500}=1.21$ and $n_{500}=1.32$ and a porosity of 30 to 50%.

In some embodiments, the surface coating comprises an amount of additive particles selected from the group comprising $CaF_2$, $SrF_2$, $BaF_2$, $AlF_3$, $SiF_4$, $ZrF_4$, $TiF_4$, and/or $ZnF_2$, said amount being 1:5 to 1:500 as measured in molar equivalent of additive to magnesium. In some embodiments, the additive particles are comprised in a ratio of 1:100, 1:10, 1:20, 1:30, 1:40 or 1:50 as measured in molar equivalent of additive to magnesium.

In some embodiments, the surface coating of the invention is characterized by a porosity of 30 to 50%. In some embodiments, the surface coating of the invention is characterized by a porosity of 40 to 55%.

In some embodiments, the surface coating of the invention is characterized by a refractivity index between $n_{500}=1.21$ and $n_{500}=1.32$.

In some embodiments, the surface coating of the invention is characterized by a refractivity index between $n_{500}=1.21$ and $n_{500}=1.32$, a porosity of 30 to 50% and an amount of additive particles selected from the group comprising LiF, $CaF_2$, $SrF_2$, $BaF_2$, $SnF_2$, $AlF_3$, $SbF_3$, $SbF_5$, $ZrF_4$, and/or $ZnF_2$. said amount being 1:5 to 1:500 as measured in molar equivalent of additive to magnesium. In some embodiments, the additive particles are comprised in a ratio of 1:100, 1:10, 1:20, 1:30, 1:40 or 1:50 as measured in molar equivalent of additive to magnesium.

According to yet another alternative of this fourth aspect of the invention, a surface coating comprising magnesium fluoride nanoparticles is provided, characterized by a refractive index of between $n_{500}=1.18$ and $n_{500}=1.35$, a porosity of 25% to 40% and an amount of additive $MF_mB_{x-m}$ particles (derived from non-magnesium additives or second magnesium additives, as described above), wherein M is selected from the group of $Li^+$, $Mg^{2+}$, $Ca^{2+}$, $Sr^{2+}$, $Ba^{2+}$, $Sn^{2+}$, $Zn^{2+}$, $Al^{3+}$, $Si^{4+}$, $Ti^{4+}$, $Zr^{4+}$, $Sn^{4+}$, $Sb^{3+}$ or $Sb^{5+}$, B can be a chloride or an oxide, x is equal to the oxidation state of the metal M and m is equal to or smaller than the oxidation state of the metal M, said amount being 1:5 to 1:100, as measured in molar equivalent of additive to magnesium.

In some embodiments, the surface coating comprises an amount additive particles (derived from non-magnesium additives or second magnesium additives, as described above) $M^{n+}F_mB_{x-m}$, with m equal to the oxidation state n of the metal M (as defined above) or with m equal to 0 or with m selected from the range of 0<m<n or mixtures thereof, said amount being 1:5 to 1:100, as measured in molar equivalent of additive to magnesium derived from the first magnesium precursor.

In general, if magnesium (or another metal) chloride or fluoride particles are present in the sol, they remain as the respective chlorides or fluorides in the surface coating, however, the other applied ligands will yield the respective magnesium (or other applied metal) oxides.

In some embodiments, the coating comprises metal additives in the same amount used in the previously discussed method for obtaining said sol solution.

In some embodiments, the surface coating comprises amount of an amount of additive $MF_mB_{x-m}$ particles (derived from non-magnesium additives or second magnesium additives, as described above), wherein M is selected from the group of $Li^+$, $Mg^{2+}$, $Ca^{2+}$, $Sr^{2+}$, $Ba^{2+}$, $Sn^{2+}$, $Zn^{2+}$, $Al^{3+}$, $Si^{4+}$, $Ti^{4+}$, $Zr^{4+}$, $Sn^{4+}$, $Sb^{3+}$ or $Sb^{5+}$, B can be a chloride or an oxide, x is equal to the oxidation state of the metal M and m is equal to or smaller than the oxidation state of the metal M, said amount being 1:5 to 1:100, as measured in molar equivalent of additive to magnesium. In some embodiments, the amount of additive ranges from 1:10 (10%) to 1:25 (4%) as measured in molar equivalent of additive to magnesium. In one embodiment, the amount of additive ranges from 1:12.5 (8%) to 1:25 (4%) as measured in molar equivalent of additive to magnesium. In some embodiments, the surface coating comprises an amount additive particles (derived from non-magnesium additives or second magnesium additives, as described above) $M^{n+}F_mB_{x-m}$ with m equal to the oxidation state n of the metal M (as defined above) or with m equal to 0 or with m selected from the range of 0<m<n or mixtures thereof. Thus, the surface coating may comprise completely fluorinated additive particles, partially fluorinated additive particles or unfluorinated additive particles.

In some embodiments, the surface coating comprises amount of an amount of additive $MF_mB_{x-m}$ particles (derived from non-magnesium additives or second magnesium additives, as described above), wherein M is selected from the group of $Li^+$, $Mg^{2+}$, $Ca^{2+}$, $Al^{3+}$, $Si^{4+}$ or $Ti^{4+}$, B can be a chloride or an oxide, x is equal to the oxidation state of the metal M and m is equal to or smaller than the oxidation state of the metal M, said amount being 1:5 to 1:100, as measured in molar equivalent of additive to magnesium. In some embodiments, the amount of additive ranges from 1:10 (10%) to 1:25 (4%) as measured in molar equivalent of additive to magnesium. In one embodiment, the amount of additive ranges from 1:12.5 (8%) to 1:25 (4%) as measured in molar equivalent of additive to magnesium. In some embodiments, the surface coating comprises an amount additive particles (derived from non-magnesium additives or second magnesium additives, as described above) $M^{n+}F_mB_{x-m}$ with m equal to the oxidation state n of the metal M (as defined above) or with m equal to 0 or with m selected from the range of 0<m<n or mixtures thereof. Thus, the surface coating may comprise completely fluorinated additive particles, partially fluorinated additive particles or unfluorinated additive particles.

In some embodiments, the surface coating comprises an amount of additive particles selected from LiX, wherein X is a halogen, in particular chloride, said amount being 1:5 to 1:100 (20% to 1%), as measured in molar equivalent of additive to magnesium. In one embodiment, the amount of LiX additive ranges from 1:10 (10%) to 1:100 (1%) as measured in molar equivalent of additive to magnesium. In one embodiment, the amount of LiX additive ranges from 1:25 (4%) to 1:100 (1%) as measured in molar equivalent of additive to magnesium. In one embodiment, the amount of LiX additive is 1:100 (1%) as measured in molar equivalent of additive to magnesium.

In some embodiments, the surface coating comprises an amount of additive particles selected from the group comprising $LiF$, $CaF_2$, $SrF_2$, $BaF_2$, $SnF_2$, $AlF_3$, $SbF_3$, $SbF_5$, $ZrF_4$, and/or $ZnF_2$, said amount being 1:5 to 1:1000, as measured in molar equivalent of additive to magnesium. In one embodiment, the amount of additive ranges from 1:20 (5%) to 1:100 (1%) as measured in molar equivalent of additive to magnesium.

In the deposited $MgF_2$-layer, the additive compounds incorporated into the AR-layers are X-ray amorphous. The high degree of structural distortion caused by the synthesis of the invention provides exciting optical and mechanic properties.

According to a fifth aspect of the invention, a metal, a glass, a polymer, in particular an organic polymer, or a thermoplast surface having a surface coating according to any of the above aspects of the invention is provided.

In some embodiments, the substrate that is to be coated is a planar or a tubular glass surface. In some embodiments, the substrate that is to be coated is a metal surface. In some embodiments, the substrate that is to be coated is an organic polymer surface. In some embodiments, the surface is a thermoplast surface.

In some embodiments, the surface is the surface of an optical system, by way of non-limiting example of a camera, an ophthalmological lense, a binocular, a microscope or a similar optical device.

In some embodiments, a $MgF_2$-layer obtained by a process or a sol according to the invention exhibits a refractive index ranging from 1.21 up to 1.30 depending on the composition of the $MgF_2$-sol and the temperature of the post-treatment procedure. The resulting composition of the $MgF_2$-sol depends e.g. on the amount of water carried into or produced by the sol reaction, the nature of eventual additives (Mg, Sr, Ba, Al, Si, Zr, Zn etc., in particular $Li^+$, $Mg^{2+}$, $Ca^{2+}$, $Sr^{2+}$, $Ba^{2+}$, $Sn^{2+}$, $Zn^{2+}$, $Al^{3+}$, $Si^{4+}$, $Ti^{4+}$, $Zr^{4+}$, $Sn^{4+}$, $Sb^{3+}$ or $Sb^{5+}$) and their concentration, and the temperature of the post-treatment. Generally, some additives increase the sintering ability of the $MgF_2$, thus, resulting in an increased mechanical robustness of the AR-layer. Whereas Al- and Li-additives do not impact the exciting optical properties, additives like Sn, Ti or Zr decrease slightly the optical transmittance due to their higher refractive indices. The inventor has found that in particular additive components (which can be a completely, a partially or a non-fluorinated compound as described above) with a low melting point increase the sintering ability and allow an increased mechanical robustness while comprising a higher porosity, thus, the influence on the optical properties is small and only a slight decrease, if at all, of the optical transmittance can be observed. Hence, the optimum content of additives has to be used in order to obtain high optical transmittance and high mechanical stability of the AR-$MgF_2$-layers as described above.

In some embodiments, for which the surface that is to be coated is an organic polymer surface, methanol based sol solutions are preferred. In some embodiments, the surface to be coated is an organic polymer surface and the sol solution comprises between 0% and 20% of additive particles selected from the group $MF_mB_{x-m}$ as described previously. In some embodiments, the surface to be coated is an organic polymer surface and the sol solution comprises between 0% and 15% of additive particles selected from the group $MF_mB_{x-m}$ as described previously. In some embodiments, the surface to be coated is an organic polymer surface and the sol solution comprises between 2% and 8% of additive particles selected from the group $MF_mB_{x-m}$ as described previously. In some embodiments, the surface to be coated is an organic polymer surface and the sol solution comprises between 0% and 2% of additive particles selected from the group $MF_mB_{x-m}$ as described previously.

In some embodiments, the surface is an organic polymer surface pretreated by a layer of polysilazane or by an inorganic network obtained through controlled hydrolysis and condensation of organically modified Si alkoxides (OR-MOCER, Fraunhofer-Institut für Silicatforschung ISC, Würzburg, Germany). In some embodiments, the surface is an organic polymer surface pretreated by corona poling.

The sol solutions provided by the present invention are particularly well suited for coating methods that benefit from or require low post-coating treatment temperatures, as incompletely reacted magnesium alkoxide precursors are decomposed at relatively low temperatures in comparison to the carboxylate precursors commonly employed.

In some embodiments, a $MgF_2$-layer obtained by a process according to the invention exhibit a mechanic stability and scratch resistance superior to that of $SiO_2$ porous AR layers known in the art.

The AR layers obtained according the present invention are characterized by an easy production starting from commercially available precursors. The sols as prepared by the method of the invention can directly be used for coating any substrate.

No other components like metal complexes, organic binders, co-polymers etc. have to be added to the sols in order to create fine-tuned porosity inside the layers. For some polymers, the presence of a mediator layer below or a cover layer above the $MgF_2$-layer is not necessary, but may be preferred to enhance optical or mechanical properties of the material.

The porosity of these layers can be tuned from 25 to 50%. In some embodiments, it ranges from 35 to 55%. The synthesis conditions for achieving a porosity up to 50% are generally determined by the sol synthesis conditions. As a rule, porosity of pure $MgF_2$ layers can be enhanced by addition of aforementioned additives during the sol synthesis.

Different to porous $SiO_2$ layers, $MgF_2$-layers obtained by the process of the present invention exhibit high degree of hydrophobicity (the contact angle after the annealing process at 450° C. is above 120°). This quality results in markedly low water uptake, which for some embodiments can be below 10% in 90% humidity, whereas it is above 90% in case of a porous $SiO_2$-layer.

In some embodiments, AR $MgF_2$ layers obtained according to the method of present invention have thicknesses ranging from 20 to 600 nm. Some embodiments are monolayers having thicknesses ranging from 80 to 120 nm.

In some embodiments, AR $MgF_2$ layers obtained according to the method of present invention show optical transmission between 98.5% and 99.8% depending on the content of additive $M^{n+}$. In general, the lower the $M^{n+}$-content, the higher is the optical transmission. In general, the lower the $Mn^+$-content, the higher is the optical transmission. Al- and Li-additives do not impact the optical properties, additives like Sn, Ti or Zr decrease slightly the optical transmittance due to their higher refractive indices. In general, the lower the additive content, the higher is the optical transmission.

In some embodiments, AR-$MgF_2$ layers obtained according to the method of present invention are characterized by high adhesion properties and high mechanical stability, especially scratch resistance according DIN EN 13523-4 (pencil test).

In some embodiments, AR-$MgF_2$ layers obtained according to the method of present invention are characterized by hydrolysis resistance superior to the corrosion/hydrolysis resistance of $SiO_2$— and $MgF_2$ layers due to the extremely low $MgF_2$ solubility and its high temperature stability.

SHORT DESCRIPTION OF THE FIGURES

Figure 1:
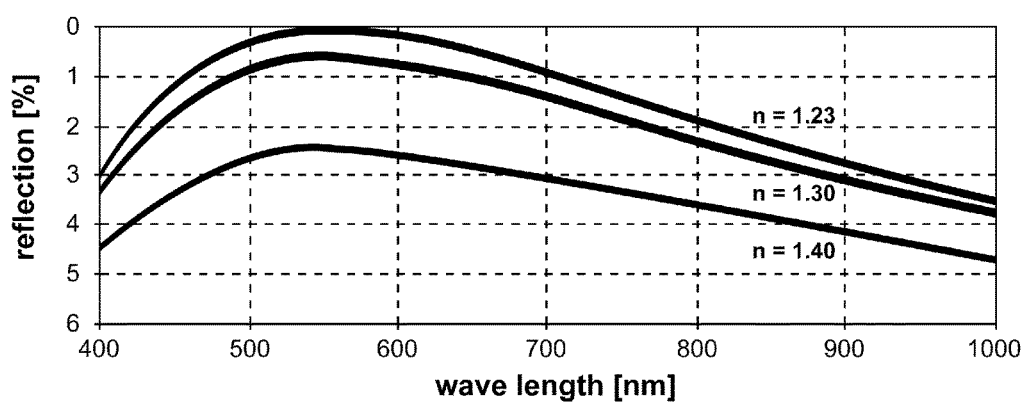
FIG. 1 shows the change in the optical transmittance of a coated material as a function of the refractive index of the thin film.
Figure 2:
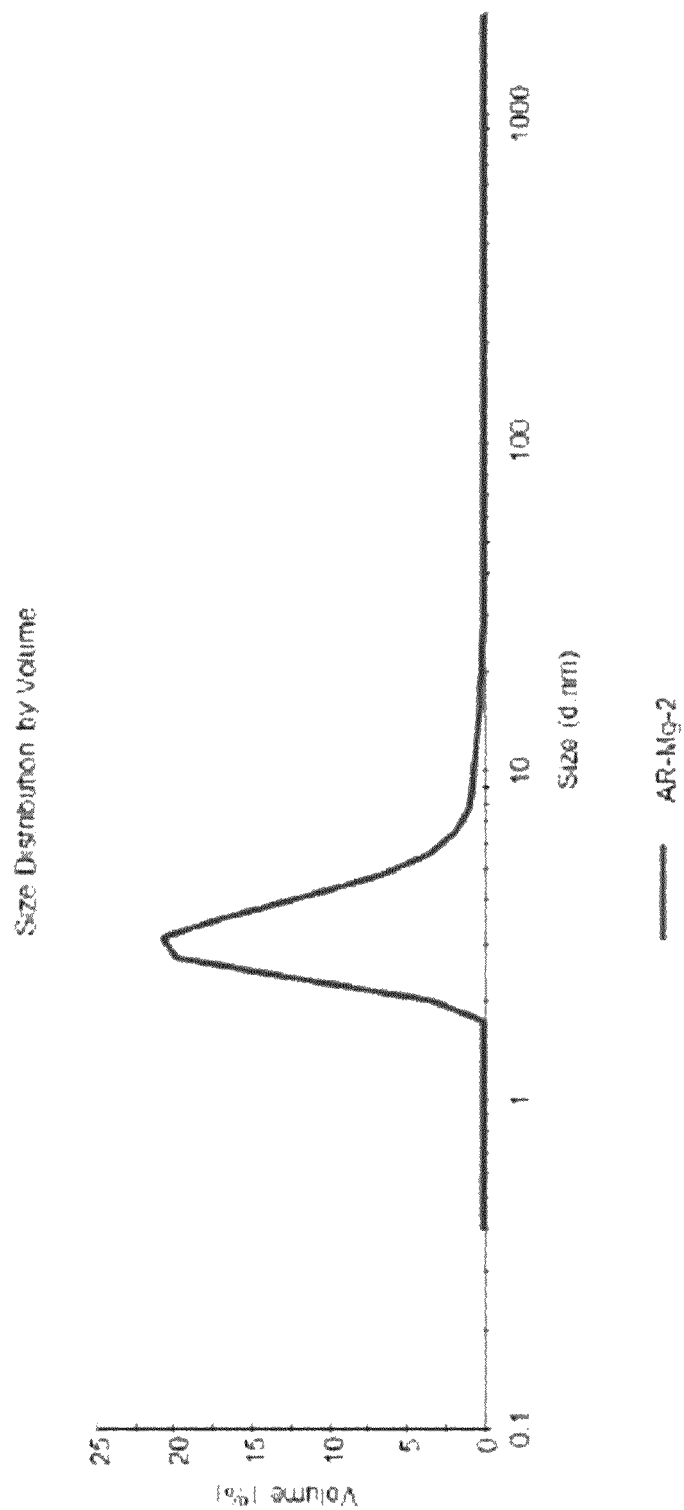
FIG. 2 shows a typical $MgF_2$-particle size distribution determined by DLS.
Figure 3:
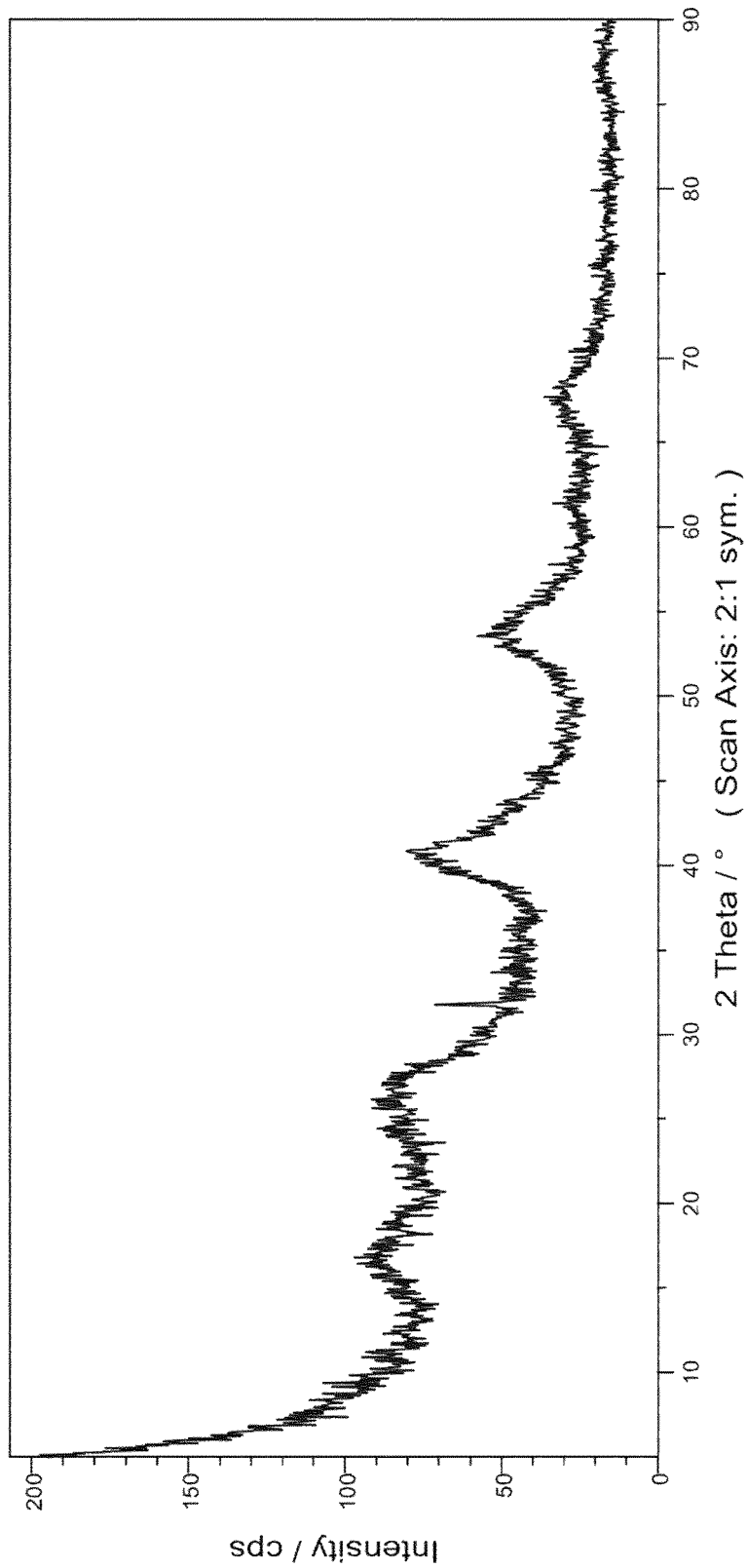
FIG. 3 shows a typical XRD-diffractogramm of a $MgF_2$-Xerogel obtained from a magnesium ethylate based $MgF_2$-Sol.
Figure 4:
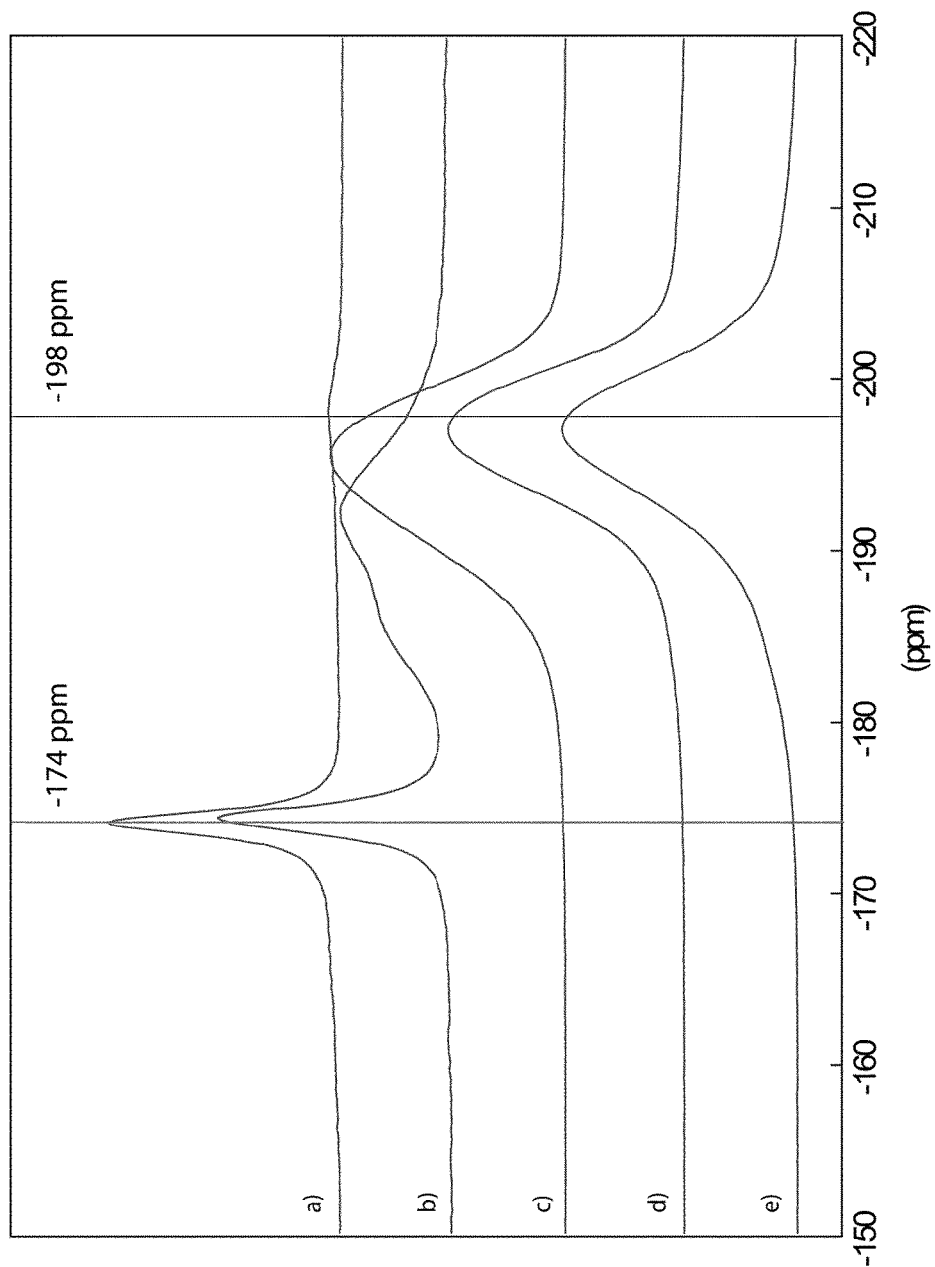
FIG. 4 shows a typical $^{19}$F-NMR-spectrum during the synthesis of a $MgF_2$ sol indicating the stage of completeness of $MgF_2$-formation (the chemical shift of −198 ppm represents pure $MgF_2$, and only the d and e graphs correspond to stoichiometric near ratios (d: F/M=1.95 and e: F/Mg=2.0))
Figure 5:
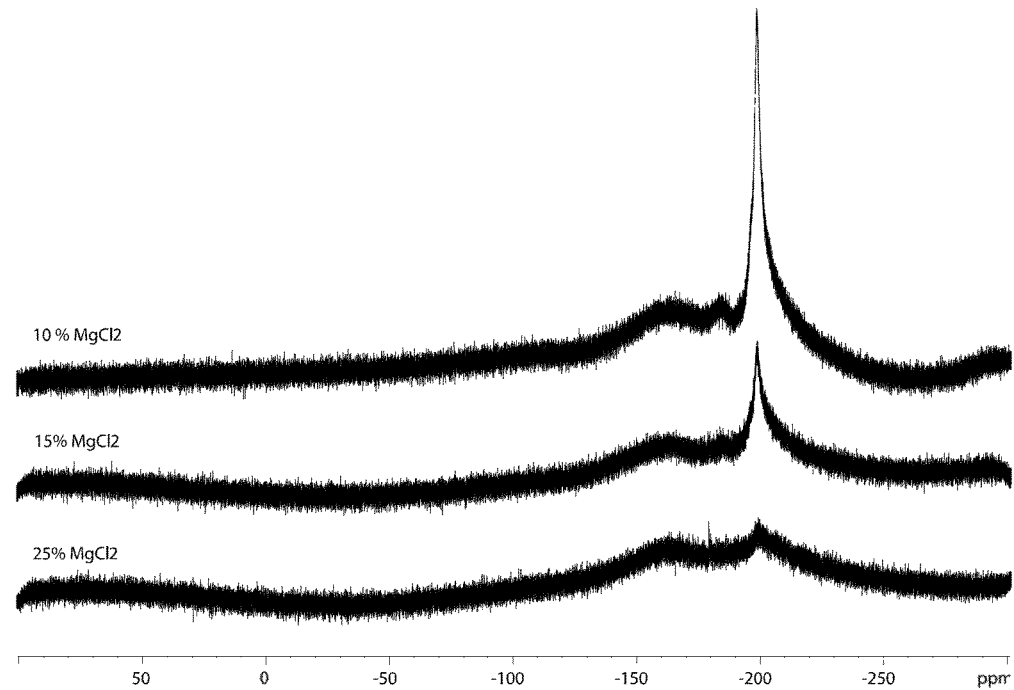
Figure 6:
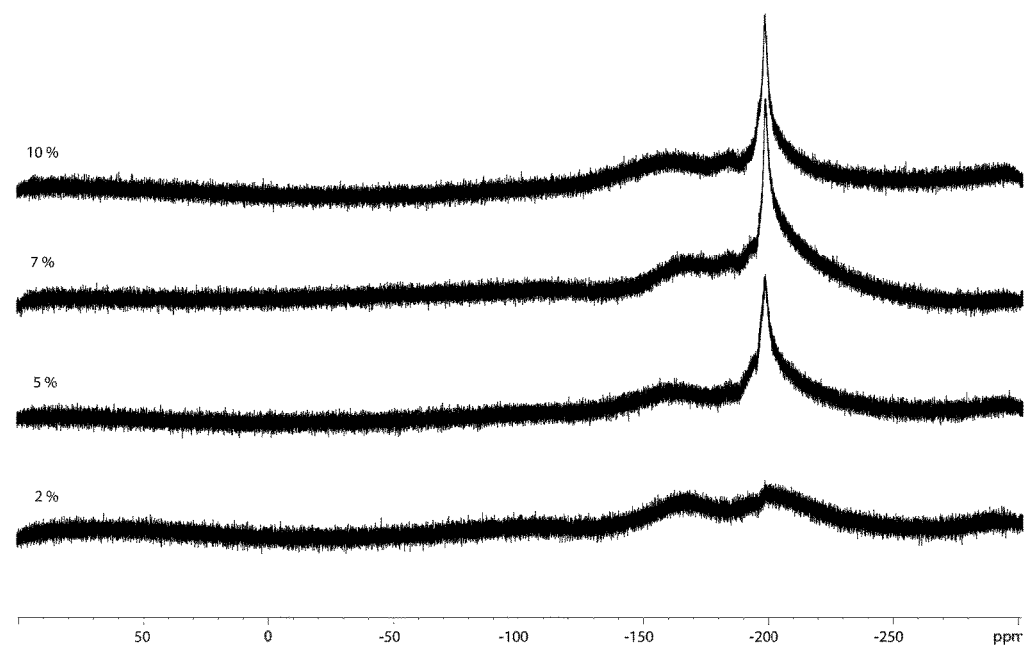

FIG. 5 $^{19}$F NMR spectra of $MgF_2$-sols prepared from $Mg(OC_2H_5)$ and $MgCl_2$ (prepared according to the general synthesis described in example 8);

FIG. 6 $^{19}$F NMR spectra of $MgF_2$-sols prepared from $Mg(OC_2H_5)$ plus $MgCl_2.6H_2O$ (prepared according to the general synthesis described in example 9).

EXAMPLES

Synthesis of Clear $MgF_2$-Sols 1) 16.29 g commercial magnesium ethylate ($MgOEt_2$) were suspended in 450 ml isopropanol. Then, 0.715 g $MgCl_2$ were dissolved therein. To this suspension, 50 ml methanol containing 6.0 g anhydrous HF (aHF) were added under rigorous stirring. After 1 day stirring at room temperature, a clear $MgF_2$-sol with a concentration of 0.3 mol/l was obtained. The kinematic viscosity of the sol was 1.1 mm$^2$ s$^{-1}$ and did not change over a period of 10 weeks.

2) 16.25 g commercial magnesium ethylate ($MgOEt_2$) were suspended in 450 ml isopropanol. Then, 0.715 g waterfree $MgCl_2$ were dissolved therein. To this suspension, 50 ml ethanol containing 6.3 g anhydrous HF (aHF) were added under rigorous stirring. After 1 day stirring at room temperature, a clear $MgF_2$-sol with a concentration of 0.3 mol/l was obtained. The kinematic viscosity of the sol was 1.1 mm$^2$ s$^{-1}$ and did not change over a period of 10 weeks.

3) 16.29 g commercial magnesium ethylate ($MgOEt_2$) and 0.83 g calcium chloride were first suspended in 400 ml ethanol. To this solution 50 ml ethanol containing 6.0 g aHF were added (molar ratio $n_{HF}/(n_{Ca2+}+n_{Mg2+})=2$; $n_{Mg2+}/n_{Ca2+}=9/1$). A clear sol formed inside only about 30 minutes having a concentration of 0.3 related to the whole 2+ metal cations and of 5 mol % Ca related to Mg. The kinematic viscosity of the sol was ca. 1.4 mm$^2$ s$^{-1}$ and remained unchanged over 6 weeks.

3') 15.4 g commercial magnesium ethylate and 1.67 g waterfree calcium chloride were first suspended in 450 ml ethanol. To this solution 50 ml ethanol containing 6 g aHF were added (molar ratio $n_{HF}/(n_{Ca2+}+n_{Mg2+})=2$; $n_{Mg2+}/n_{Ca2+}=9/1$). A clear sol formed inside only about 4 hours having a concentration of 0.3 related to the whole $M^{2+}$ cations. The kinematic viscosity of the sol was ca. 1.4 mm$^2$ s$^{-1}$ and remained unchanged over 6 weeks. Following the same synthesis procedure, $MgF_2$-sols based on different amount of added $CaCl_2$ were obtained by changing the $Mg(OC_2H_5)_2$ to $CaCl_2$ ratio but keeping the overall $M^{2+}$-concentration ($M=Mg^{2+}+Ca^{2+}$) and the amount of HF (molar HF/M ratio=2.0) and all the other reaction conditions constant. These results are summarized in the table 1.

TABLE 1

In all batches magnesium ethylate and CaCl$_2$ together gave 0.15 mol M$^{2+}$ in 450 ml ethanol. In all batches 6 g HF in 50 ml ethanol were used (molar HF/Mg ratio = 2.0).

| No | Mg(OC$_2$H$_5$)$_2$ to CaCl$_2$·molar ratio | clear after hours | viscosity mm$^2$s$^{-1}$ after 6 weeks | remarks |
|---|---|---|---|---|
| a | 95/5 | 16 | 1.3 | stable viscosity |
| b | 90/10 | 4 | 1.3 | stable viscosity |
| c | 80/20 | 3 | 1.4 | stable viscosity |

4) 17.5 g commercial magnesium ethylate and 1.5 g aluminium chloride were first suspended in 400 ml ethanol. To this solution 50 ml ethanol containing 6 g aHF were added. A clear sol formed within about 60 minutes exhibiting a concentration of 0.3 mol/l and having 5 mol % Al$^{3+}$ related to MgF$_2$. The kinematic viscosity of the sol was ca. 1.2 mm$^2$ s$^{-1}$ and remained unchanged over 6 weeks.

4') 16.25 g commercial magnesium ethylate and 1 g waterfree aluminium chloride were first suspended in 400 ml ethanol. To this solution 50 ml ethanol containing 6 g aHF were added. A clear sol formed within about 60 minutes exhibiting a concentration of 0.3 mol/l and having 5 mol % Al$^{3+}$ related to MgF$_2$. The kinematic viscosity of the sol was ca. 1.2 mm$^2$ s$^{-1}$ and remained unchanged over 6 weeks.

5) 15.5 g freshly prepared magnesium methylate plus 1.4 g dried MgCl$_2$ were suspended in 450 ml ethanol. To this solution, 50 ml ethanol containing 8.0 g anhydrous HF (aHF) were added under rigorous stirring. After 24 hours stirring at room temperature, a clear ethanolic MgF$_2$-sol with a concentration of 0.4 mol/l was obtained. The kinematic viscosity of the sol was 1.2 mm$^2$ s$^{-1}$ and did not change over a period of 10 weeks.

6) 15.5 g freshly prepared magnesium methylate plus 1.7 g dried CaCl$_2$ were suspended in 450 ml ethanol. To this solution, 50 ml ethanol containing 8.0 g anhydrous HF (aHF) were added under rigorous stirring. After 20 hours stirring at room temperature, a clear ethanolic MgF$_2$-sol with a concentration of 0.36 mol/l with 10% CaF$_2$ (overall MF$_2$ concentration 0.4) was obtained. The kinematic viscosity of the sol was 1.3 mm$^2$ s$^{-1}$ and did not change over a period of 10 weeks.

7) 17.2 g freshly prepared magnesium methylate plus 0.6 g dried LiCl were suspended in 450 ml ethanol. To this solution, 50 ml ethanol containing 8.0 g anhydrous HF (aHF) were added under rigorous stirring. After 28 hours stirring at room temperature, a clear ethanolic MgF$_2$-sol with a concentration of 0.4 mol/l containing 10 mol % LiCl was obtained. The kinematic viscosity of the sol was 1.3 mm$^2$ s$^{-1}$ and did not change over a period of 10 weeks.

8) 16.25 g commercial magnesium ethylate were suspended in 450 ml ethanol. Then, 0.715 g waterfree MgCl$_2$ were dissolved. To this suspension, 50 ml ethanol containing 6 g anhydrous HF (aHF) were added under rigorous stirring. After 1 day stirring at room temperature, a clear ethanolic MgF$_2$-sol with a concentration of 0.3 mol/l was obtained. The kinematic viscosity of the sol was 1.1 mm$^2$ s$^{-1}$ and did not change over a period of 10 weeks. Following the same synthesis procedure, MgF$_2$-sols based on different amount of added waterfree MgCl$_2$ were obtained by changing the Mg(OC$_2$H$_5$)$_2$ to MgCl$_2$ ratio but keeping the overall Mg$^{2+}$-concentration and the amount of HF (molar HF/Mg ratio=2.0) and all the other reaction conditions constant. These results are summarized in the table 2.

TABLE 2

In all batches magnesium ethylate and MgCl$_2$ together gave 0.15 mol Mg$^{2+}$ in 450 ml ethanol. In all batches 6 g HF in 50 ml ethanol were used (molar HF/Mg ratio = 2.0).

| No | Mg(OC$_2$H$_5$)$_2$ to MgCl$_2$ molar ratio | clear after hours | viscosity mm$^2$s$^{-1}$ after 6 weeks | remarks |
|---|---|---|---|---|
| a | 95/5 | 24 | 1.4 | stable viscosity |
| b | 90/10 | 18 | 1.4 | stable viscosity |
| c | 80/20 | 12 | 1.5 | stable viscosity |

9) 16.25 g commercial magnesium ethylate were suspended in 450 ml ethanol. Then, 1.5 g magnesium chloride hexahydrate, MgCl$_2$.6H$_2$O, were dissolved. To this suspension, 50 ml ethanol containing 6 g anhydrous HF (aHF) were added under rigorous stirring. After 15 hours stirring at room temperature, a clear ethanolic MgF$_2$-sol with a concentration of 0.3 mol/l was obtained. The kinematic viscosity of the sol was 1.2 mm$^2$ s$^{-1}$ and did not change over a period of 10 weeks. Following the same synthesis procedure, MgF$_2$-sols based on different amount of added MgCl$_2$.6H$_2$O were obtained by changing the Mg(OC$_2$H$_5$)$_2$ to MgCl$_2$.6H$_2$O ratio but keeping the overall Mg$^{2+}$-concentration and the amount of HF (molar HF/Mg ratio=2.0) and all the other reaction conditions constant. These results are summarized in the table 3.

TABLE 3

In all batches magnesium ethylate and MgCl$_2$·6H$_2$O together gave 0.15 mol Mg$^{2+}$ in 450 ml ethanol. In all batches 6 g HF in 50 ml ethanol were used (molar HF/Mg ratio = 2.0).

| No | Mg(OC$_2$H$_5$)$_2$ to MgCl$_2$·6H$_2$O molar ratio | clear after hours | viscosity mm$^2$s$^{-1}$ after 6 weeks | remarks |
|---|---|---|---|---|
| a | 95/5 | 24 | 1.4 | stable viscosity |
| b | 90/10 | 15 | 1.3 | stable viscosity |
| c | 80/20 | 10 | 1.4 | stable viscosity |

10) 16.25 g commercial magnesium ethylate were suspended in 450 ml ethanol. Then, 1.65 g calcium chloride hexahydrate, CaCl$_2$.6H$_2$O, were dissolved. To this suspension, 50 ml ethanol containing 6 g anhydrous HF (aHF) were added under rigorous stirring. After 2 hours stirring at room temperature, a clear ethanolic MgF$_2$-sol with a concentration of 0.3 mol/l was obtained. The kinematic viscosity of the sol was 1.3 mm$^2$ s$^{-1}$ and did not change over a period of 10 weeks. Following the same synthesis procedure, MgF$_2$-sols based on different amount of added CaCl$_2$.6H$_2$O were obtained by changing the Mg(OC$_2$H$_5$)$_2$ to CaCl$_2$.6H$_2$O ratio but keeping the overall Mg$^{2+}$-concentration and the amount of HF (molar HF/Mg ratio=2.0) and all the other reaction conditions constant. These results are summarized in the table 4.

TABLE 4

In all batches magnesium ethylate and CaCl$_2$•6H$_2$O together gave 0.15 mol M$^{2+}$ in 450 ml ethanol. In all batches 6 g HF in 50 ml ethanol were used (molar HF/Mg ratio = 2.0).

| Mg(OC$_2$H$_5$)$_2$ to CaCl$_2$•6H$_2$O molar ratio | clear after hours | viscosity mm$^2$s$^{-1}$ after 6 weeks | remarks |
|---|---|---|---|
| 95/5 | 4 | 1.2 | stable viscosity |
| 90/10 | 2 | 1.3 | stable viscosity |
| 80/20 | 1 | 1.3 | stable viscosity |

11) 17.1 g commercial magnesium ethylate were first suspended in 400 ml ethanol. To this solution 50 ml ethanol containing 6 g aHF were added. Then immediately 1.56 g tetraethoxysilan (TEOS) were added. A clear sol formed within about 36 hours exhibiting a concentration of 0.3 mol/l and having 5 mol % Si$^{4+}$ related to MgF$_2$. The kinematic viscosity of the sol was ca. 1.5 mm$^2$ s$^{-1}$ and remained unchanged over 6 weeks.

12) 17.1 g commercial magnesium ethylate were first suspended in 400 ml ethanol. To this solution 50 ml ethanol containing 6 g aHF were added. Then immediately 2.45 g zirconium-n-propylat (Zr(O"R)$_4$) were added. A clear sol formed within about 48 hours exhibiting a concentration of 0.3 mol/l and having 5 mol % Zr$^{4+}$ related to MgF$_2$. The kinematic viscosity of the sol was ca. 1.5 mm$^2$ s$^{-1}$ and remained unchanged over 6 weeks.

13) 17.1 g commercial magnesium ethylate were first suspended in 400 ml ethanol. To this solution 50 ml ethanol containing 6 g aHF were added. Then immediately 2.13 g titaniumisopropoxide Ti[OCH(CH$_3$)$_2$]$_4$ were added. A clear sol formed within about 40 hours exhibiting a concentration of 0.3 mol/l and having 5 mol % Ti$^{4+}$ related to MgF$_2$. The kinematic viscosity of the sol was ca. 1.4 mm$^2$ s$^{-1}$ and remained unchanged over 6 weeks.

14) 16.6 g commercial magnesium ethylate and 0.5 g waterfree calcium chloride and 2.31 g titaniumisopropoxide Ti[OCH(CH$_3$)$_2$]$_4$ were first suspended in 450 ml ethanol. To this solution 50 ml ethanol containing 6 g aHF were added (molar ratio $n_{HF}/(n_{Ca2+}+n_{Mg2+})=2$; $n_{Mg2+}/n_{Ca2+}=97/3$). A clear sol formed inside of 18 hours having a concentration of 0.3 related to the whole M$^{2+}$ cations. The content of Ti[OCH(CH$_3$)$_2$]$_4$ related to the overall MF$_2$-content was 5 mol %. The kinematic viscosity of the sol was ca. 1.3 mm$^2$ s$^{-1}$ and remained stable over 6 weeks.

15) 16.6 g commercial magnesium ethylate and 0.5 g waterfree calcium chloride and 2.45 g zirconium-n-propylat (Zr(O"R)$_4$) were first suspended in 450 ml ethanol. To this solution 50 ml ethanol containing 6 g aHF were added (molar ratio $n_{HF}/(n_{Ca2+}+n_{Mg2+})=2$; $n_{Mg2+}/n_{Ca2+}=97/3$). A clear sol formed inside of 26 hours having a concentration of 0.3 related to the whole M$^{2+}$ cations. The content of Zr(O"R)$_4$ related to the overall MF$_2$-content was 5 mol %. The kinematic viscosity of the sol was ca. 1.5 mm$^2$ s$^{-1}$ and remained stable over 6 weeks.

16) 16.6 g commercial magnesium ethylate and 0.5 g waterfree calcium chloride and 1.56 g tetraethoxysilan (TEOS) were first suspended in 450 ml ethanol. To this solution 50 ml ethanol containing 6 g aHF were added (molar ratio $n_{HF}/(n_{Ca2+}+n_{Mg2+})=2$; $n_{Mg2+}/n_{Ca2+}=97/3$). A clear sol formed inside of 12 hours having a concentration of 0.3 related to the whole M$^{2+}$ cations. The content of TEOS related to the overall MF$_2$-content was 5 mol %. The kinematic viscosity of the sol was ca. 1.5 mm$^2$ s$^{-1}$ and remained stable over 6 weeks.

17) 16.6 g commercial magnesium ethylate and 0.5 g waterfree calcium chloride and 1.53 g aluminium isopropoxide Al[OCH(CH$_3$)$_2$]$_3$ were first suspended in 450 ml ethanol. To this solution 50 ml ethanol containing 6 g aHF were added (molar ratio $n_{HF}/(n_{Ca2+}+n_{Mg2+})=2$; $n_{Mg2+}/n_{Ca2+}=97/3$). A clear sol formed inside of 26 hours having a concentration of 0.3 related to the whole M$^{2+}$ cations. The content of Al[OCH(CH$_3$)$_2$]$_3$ related to the overall MF$_2$-content was 5 mol %. The kinematic viscosity of the sol was ca. 1.4 mm$^2$ s$^{-1}$ and remained stable over 6 weeks.

18) 16.6 g commercial magnesium ethylate and 0.5 g waterfree calcium chloride and 1.53 g aluminium isopropoxide Al[OCH(CH$_3$)$_2$]$_3$ were first suspended in 450 ml ethanol. To this solution 50 ml ethanol containing 6.23 g aHF were added (molar ratio $n_{HF}/(n_{Ca2+}+n_{Mg2+})=2$; and $n_{HF}/n_{Al3+}=3/1$, $n_{Mg2+}/n_{Ca2+}=97/3$). A clear sol formed inside of 20 hours having a concentration of 0.3 related to the whole M$^{2+}$ cations. The content of Al[OCH(CH$_3$)$_2$]$_3$ related to the overall MF$_2$-content was 5 mol %. The kinematic viscosity of the sol was ca. 1.3 mm$^2$ s$^{-1}$ and remained stable over 6 weeks.

19) Four different reactions systems were prepared consisting of 16.29 g commercial magnesium ethylate that was suspended in 450 ml ethanol each. Then, to these 4 suspensions MgCl$_2$.6H$_2$O was given (dissolved): a) 6.26 g, b) 1.566 g, c) 2.191 g, and c) 3.13 g. To this suspension, 50 ml ethanol containing a) 5.83 g, b) 6.00 g, c) 6.12 g, and d) 6.29 g anhydrous HF (aHF) were added under rigorous stirring. After 1 day stirring at room temperature, a clear ethanolic MgF$_2$-sol with a concentration of 0.3 mol/l was obtained. The kinematic viscosity of the sol was 1.1 mm$^2$ s$^{-1}$ and did not change over a period of 10 weeks.

MgF$_2$-Sols without Addition of an Additive

A) 17.2 g freshly prepared magnesium methylate were suspended in 450 ml ethanol. To this suspension, 50 ml ethanol containing 8.0 g anhydrous HF (aHF) were added under rigorous stirring. No clear sol was obtained instead a turbid non-transparent suspension of large MgF$_2$ particles was formed which did not clear up even after several weeks stirring.

B) 22.8 g commercial magnesium ethylate were suspended in 450 ml methanol. To this suspension, 50 ml methanol containing 8.0 g anhydrous HF (aHF) were added under rigorous stirring. No clear sol was obtained instead a non-transparent suspension of large MgF$_2$ particles was formed which did not clear up even after several weeks stirring.

C) 17.1 g commercial magnesium ethylate were suspended in 450 ml ethanol. To this suspension, 50 ml ethanol containing 6.0 g anhydrous HF (aHF) were added under rigorous stirring. No clear sol was obtained instead a non-transparent suspension of large MgF$_2$ particles was formed which did not clear up even after several weeks stirring and did not give transparent coatings on glass.

Formation of MgF$_2$-AR-Layers on Glass Substrates

The general procedure of producing AR-layers based on sols obtained according the procedures described under 1) to 4) followed the following general protocol. Optiwhite glass substrates (Pilkington, Gelsenkirchen, Germany) of 100× 150 mm were dip-coated with the respective MgF$_2$-sol. Before dip coating the substrates were cleaned with an alkaline cleaning solution and finally neutralized by washing with de-ionized water. After a drying step at 80° C. for 10 min all samples were finally annealed at 450° C. for 15 min. For this, the samples were heated by 5° C. per minute up to 450°, kept there for 15 min and then with the same heatingprogramm cooled down.

Formation of AR-Layers on Polymer Surfaces

The durability of the MgF$_2$ sols obtained according the procedures 1) to 4) was performed by dip-coating technique. Plates/foils of several polymers (polyethylene terephthalate (PET), fluorinated ethylene polypropylene (FEP), polyethersulfone (PES), polycarbonate (PC), ethylene tetrafluoroethylene (ETFE), polymethylmethacrylate (PMMA), PC Lexan (amorphous polycarbonate polymer), Zeonex (cyclic olefin polymer, CAS No 26007-43-2), Makrolon (polycarbonate)) were generally first cleaned by treating them with different organic solvents and then either directly coated without any further treatment or Corona pre-treated or in some cases, a mediator layer made from either Ormosil@ or Silazanes was first deposited in order to improve the grafting properties.

Characterization of the MgF$_2$-Sols

The hydrodynamic diameter of the nano particles was determined by dynamic light scattering (DLS) measurements using a Zetasizer Nano ZS (Malvern Instruments, Worcestershire, UK) using quartz cuvettes flushed with an argon atmosphere. The viscosity was determined simultaneous to DLS measurements with a microviscometer from Anton Paar (AMVn; Graz, Austria) at 25° C. Hydrodynamic diameter were calculated by deconvolution of the correlation functions into exponential functions using non-negatively constrained least squares (NNLS) fitting algorithm as implemented in the Malvern Nanosizer software. The zeta potential was determined from the electrophoretic mobilities of the particles in the sol using the Smoluchowski relation.

Characterization of the MgF$_2$-AR-Layers

The refractive indices and the optical transmission and reflectance, respectively, were determined by ellipsometric measurements with a variable angle UV-V is spectroscopic ellipsometer SE850 of the company SENTECH Instruments GmbH in the wavelength range between 350 nm and 1000 nm. For the evaluation and fitting of the refraction indices n and the absorption k were used the data set in the visible range (350-800 nm) using the CAUCHY model. The reported refractive indices were taken at a wavelength of 589 nm.

The mechanical stability of the AR-layers was tested according the pencil test using a Linartester 249 from ERICHSEN GmbH & Co KG, Germany. In this test, pencil leads of increasing hardness values are forced against a coated surface in a precisely defined manner until one lead mars the surface. Surface hardness is defined by the hardest pencil grade which just fails to mar the painted surface.

$^{19}$F MAS NMR spectra were recorded on a Bruker Avance 400. The chemical shifts of the nuclei are given with respect to CFCl$_3$ for $^{19}$F.

XRD measurements were performed with the FPM7 equipment (Rich. Seiffert & Co., Freiberg) with Cu Kα (Cu Kα1.2, λ=1.542 Å) radiation (2Θ range: 5°≤2Θ≤64°).

All the sols described under 1) to 18) gave AR-layers which do not differ remarkably from each other based on simple eye inspection. The characteristic data of the MgF$_2$—Ar-layers made are summarized in Table 5.

Table 5 summarizes the main characteristics of Ar-layers on Optiwhite glass

| Sample | Layer thickness [nm] | Refractive sindex $n_{550}$ | Pencil -Test |
|---|---|---|---|
| (1) | 117 | 1.2747 | 6 H |
| (3) | 121 | 1.24 | 6 H-7 H |
| (3'a) | 125 | 1.27 | 7 H |
| (3*b) | 120 | 1.29 | 9 H |
| (3'c) | 121 | 1.31 | 9 H |
| (4) | 107 | 1.27 | 3 H-4 H |
| (4') | 107 | 1.27 | 3 H-4 H |
| 8a | 116 | 1.26 | 3 H-4 h |
| 8b | 123 | 1.25 | 4 H-5 H |
| 8c | 119 | 1.26 | 4 H-5 H |
| 11 | 121 | 1.24 | 6 H-7 H |
| 12 | 110 | 1.28 | 3 H |
| 13 | 109 | 1.29 | 4 H |
| 14 | 105 | 1.26 | 9 H |
| 15 | 112 | 1.27 | 4 H |
| 16 | 109 | 1.25 | 6 H |
| 17 | 110 | 1.24 | 8 H |
| 18 | 112 | 124 | 8 H |

The invention claimed is:

1. A method for obtaining a magnesium fluoride (MgF$_2$) sol solution, comprising the steps of
    (a) providing a magnesium alkoxide in a non-aqueous solvent in a first volume and
    (b) adding, in a second volume, 1.85 to 2.05 molar equivalents of anhydrous hydrogen fluoride (HF) to said magnesium alkoxide,
    wherein
    (c) the reaction proceeds in the presence of
        (i) a second magnesium fluoride precursor selected from the group consisting of chloride, bromide, iodide, nitrate and triflate of magnesium, and/or
        (ii) at least one additive non-magnesium fluoride precursor selected from the group consisting of chloride, bromide, iodide, nitrate or triflate of lithium, antimony, tin, calcium, strontium, barium, aluminium, silicon, zirconium, titanium and zinc,
    wherein said additive second magnesium fluoride precursor or additive non-magnesium fluoride precursor is present in a quantity ranging from 1% to 20% as measured in molar equivalents of said magnesium alkoxide.

2. The method according to claim 1, wherein said second magnesium fluoride precursor is slected from the group consisting of a chloride, a bromide, an iodide, a nitrate, and a triflate of Mg$^{2+}$ and said additive non-magnesium fluoride precursor is selected from the group consisting of a chloride, a bromide, an iodide and a nitrate of Li$^+$, Ca$^{2+}$, Sr$^{2+}$, Ba$^{2+}$, Zn$^{2+}$, Al$^{3+}$, Si$^{4+}$, Zr$^{4+}$, Sn$^{4+}$, Sb$^{3+}$, Sb$^{5+}$, or Ti$^{4+}$.

3. The method according to claim 1, wherein an additional amount of hydrogen fluoride ($n_{adHF}$) is present in the fluorination of step b computed according to the formula $$n_{adHF} = (n_M * \chi_{additive}) * Ox * A, \text{ wherein}$$

$n_M$ is the molar amount of said magnesium alkoxide,
$\chi_{additive}$ is the molar percentage of said second magnesium fluoride precursor or said non-magnesium fluoride precursor, wherein
$\chi_{additive}$ is in the range of 1% to 20%, and
Ox is the oxidation state of the metal of said second magnesium fluoride precursor or said non-magnesium fluoride precursor, and
A is selected from 0≤A≤1.

4. The method according to claim 1, wherein the reaction proceeds in the presence of a catalytic amount of a strong, volatile acid.

5. The method according to claim 1, wherein said non-aqueous solvent is ethanol and/or the water content of the sol solution is equal to or lower than 2.0 molar equivalents in relation to the magnesium content of the solution.

6. A method for coating a surface, comprising the steps of
   (a) providing a magnesium fluoride sol solution produced by the method according to claim 1;
   (b) contacting said surface with said magnesium fluoride sol solution;
   (c) drying said surface;
   (d) exposing said surface in a first thermal step to a first temperature ranging from 15° C. to 480° C., from 10° C. to 100° C., or from 250° C. to 480° C.

7. The method for coating a surface according to claim 6, wherein after said first thermal step, a second thermal step is applied wherein said surface is exposed to a second temperature ranging from 250° C. to 480° C.

8. A method for obtaining a magnesium fluoride ($MgF_2$) sol solution, comprising the steps of
   (a) providing a magnesium alkoxide in a non-aqueous solvent in a first volume and
   (b) adding, in a second volume, 1.85 to 2.05 molar equivalents of anhydrous hydrogen fluoride (HF) to said magnesium alkoxide, wherein
   (c) the reaction proceeds in the presence of
      (i) at least one additive non-magnesium fluoride precursor selected from the group consisting of chloride, bromide, iodide, nitrate or triflate of calcium, strontium, barium, aluminum, silicon, zirconium, titanium and zinc,
wherein said additive non-magnesium fluoride precursor is present in a quantity ranging from 1% to 20% as measured in molar equivalents of said magnesium alkoxide.

* * * * *